(12) United States Patent
Takahashi et al.

(10) Patent No.: US 6,917,088 B2
(45) Date of Patent: Jul. 12, 2005

(54) MAGNETO-RESISTIVE DEVICES

(75) Inventors: Hiromasa Takahashi, Hachioji (JP); Jun Hayakawa, Inagi (JP); Susumu Soeya, Kodaira (JP); Kenchi Ito, Sendai (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/331,664

(22) Filed: Dec. 31, 2002

(65) Prior Publication Data
US 2004/0004261 A1 Jan. 8, 2004

(30) Foreign Application Priority Data
Jul. 5, 2002 (JP) .................................... 2002-196662

(51) Int. Cl.$^7$ ............................................. H01L 29/82
(52) U.S. Cl. ..................... 257/422; 257/421; 365/8; 365/158; 330/62; 324/207.21; 324/252; 438/48
(58) Field of Search ................ 257/421, 422–427, 257/E27.006; 365/8, 158; 330/62; 324/207.21, 252; 438/48

(56) References Cited
U.S. PATENT DOCUMENTS 5,422,571 A * 6/1995 Gurney et al. ............. 324/252
5,793,279 A * 8/1998 Nepela ....................... 338/32 R
5,889,640 A * 3/1999 Hayashi et al. .......... 360/324.11
2002/0085319 A1 * 7/2002 Hayakawa ................ 360/324.2
2003/0017723 A1 * 1/2003 Hiramoto et al. ............ 438/958
2003/0197986 A1 * 10/2003 Ambrose et al. ....... 360/324.11

FOREIGN PATENT DOCUMENTS

| JP | 03-154217 A | 7/1991 |
| JP | 04-358310 A | 12/1992 |
| JP | 07-221363 A | 8/1995 |
| JP | 10-091925 A | 4/1998 |
| WO | WO 97/44781 A1 | 11/1997 |

* cited by examiner

Primary Examiner—Nathan J. Flynn
Assistant Examiner—Scott R. Wilson
(74) Attorney, Agent, or Firm—Antonelli, Terry, Stout & Kraus, LLP

(57) ABSTRACT

A magneto-resistive device has a high reproducing output and is suitable for use as a CPP-GMR device. The magneto-resistive device has a first magnetic layer, a second magnetic layer, and a non-magnetic spacer formed between the first and second magnetic layers. The first magnetic layer contains a magnetic material whose conduction electrons belong to a first energy band, and the second magnetic layer contains a magnetic material whose conduction electrons belong to a second energy band. The first and second energy bands are attributable to orbitals of the same kind, thereby increasing the ratio of change in magnetoresistance and adjusting the electric resistance.

20 Claims, 21 Drawing Sheets

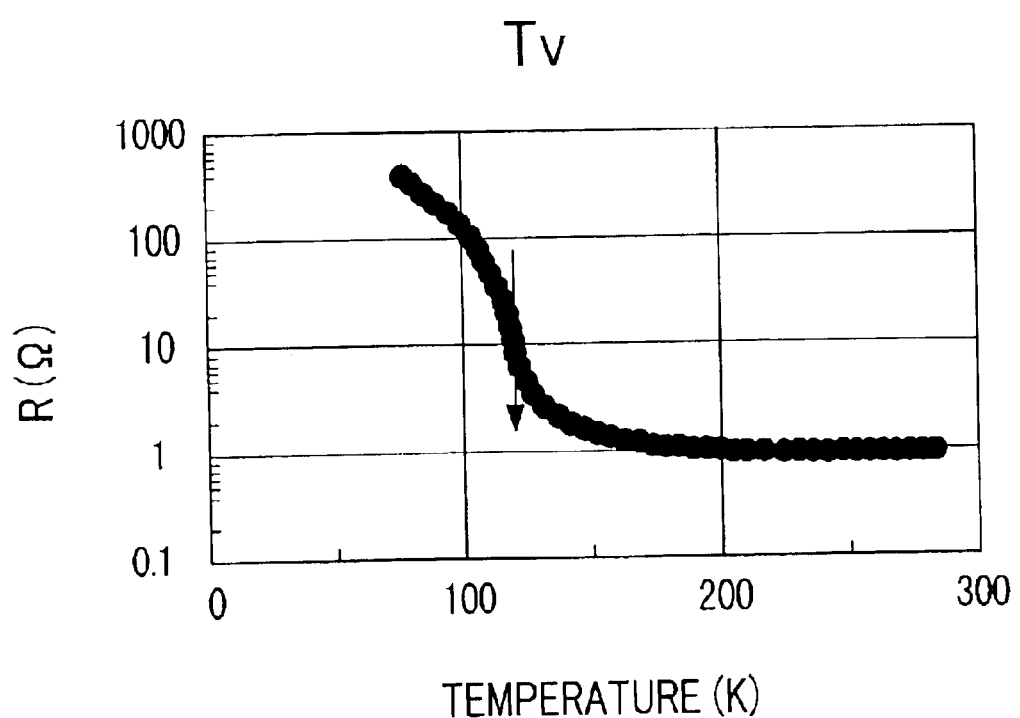

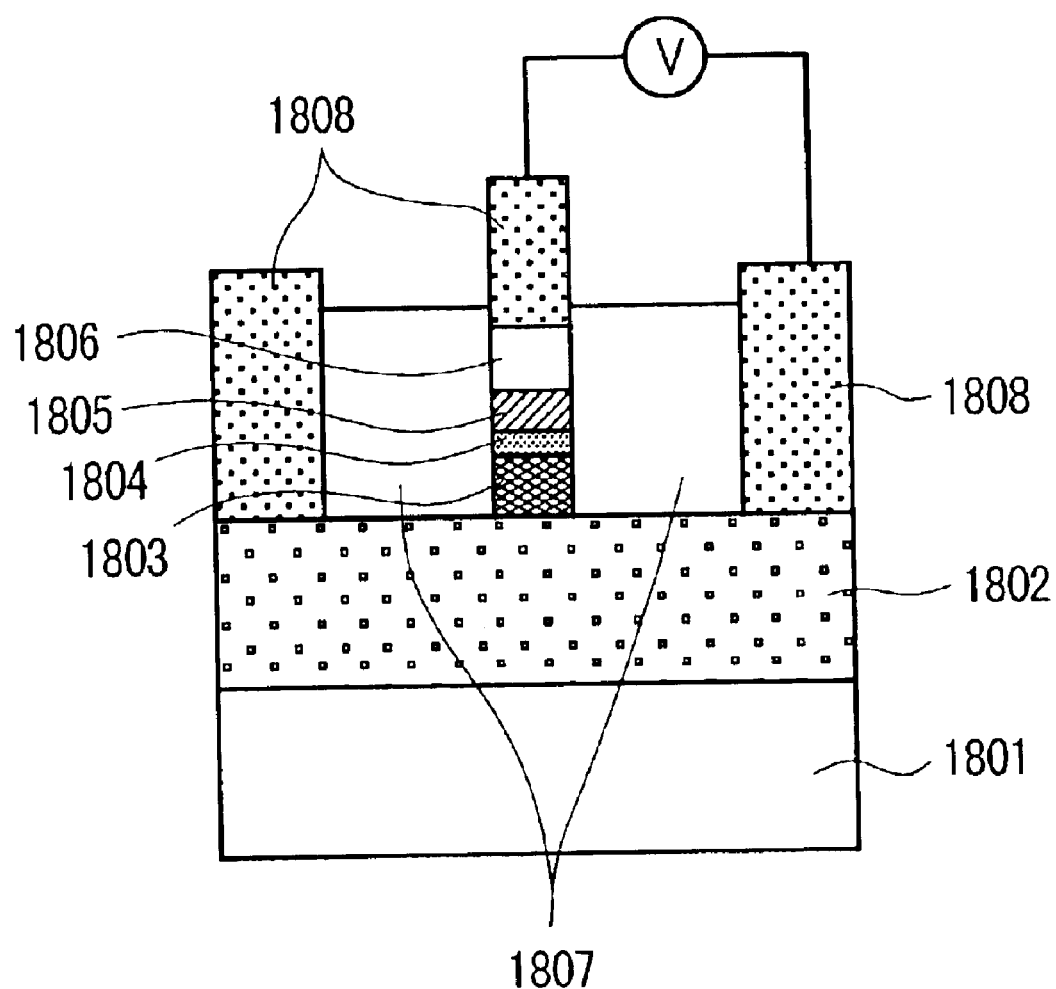

MAGNETO-RESISTIVE DEVICES

BACKGROUND OF THE INVENTION

The present invention relates to a magneto-resistive device, and to any component, such as a magnetic head, a magnetic recording device, and a magnetic memory, which is provided with said magneto-resistive device.

Magnetic recording-reproducing devices have recently exhibited a significant improvement in recoding density. They are provided with a magnetic recording-reproducing head which requires both a high recording performance and a high reproducing performance.

What is particularly required of magnetic recording heads is technical innovation for (1) a higher sensitivity, (2) a smaller track width, and (3) a smaller reproducing gap.

Higher sensitivity leads to higher recording density. A recording density of the order of 1–10 Gb/in$^2$ relies on the anisotropic magneto-resistive effect (AMR), and a recording density of the order of 10–20 Gb/in$^2$ relies on the giant magneto-resistive effect (GMR), which gives a higher sensitivity. Moreover, it is expected that a much higher recording density of the order of 20–50 Gb/in$^2$ will be attained with the help of advanced GMR, such as specular GMR and NOL-GMR (nano-oxide layer type GMR), which has a highly polarized material or an oxide layer interposed between the interfaces of a GMR structure for producing an increased output through the multiple reflection effect of electron spin.

A magnetic head relying on GMR is disclosed in JP-A No. 358310/1992. This magnetic head, which has a spin valve structure, consists of a pinned layer, a non-magnetic thin film (spacer), a free layer, and a magneto-resistive device. The pinned layer consists of a magnetic body whose magnetization is fixed in a specific direction by an anti-ferromagnetic layer. The non-magnetic thin film is laminated on the pinned layer. The free layer is a magnetic film which is laminated on the non-magnetic thin film. The magneto-resistive device changes in electrical resistance depending on the relative angle of magnetization of the pinned layer and the free layer.

The higher recording density expected in the future needs a reproducing system which is much more sensitive than before. A recording density of the order of 70–150 Gb/in$^2$ will rely on the tunneling magneto-resistive effect (TMR) with an extremely high MR ratio because of its high sensitivity. A higher recording density exceeding 150 Gb/in$^2$ will rely mainly on CPP-GMR (current perpendicular to plane geometry GMR) which works with a detecting current flowing in the direction perpendicular to the film surface. The basic technology of TMR is disclosed in P03-154217 and JP-A 91925/1998. Unfortunately, it needs further improvement in the prevention of breakdown by static voltage (due to the very thin insulator that is important for the characteristic properties), reduced resistance for better S/N ratio, and increased bias.

The conventional CIP-GMR device (current-in-plane GMR, in which the detecting current flows in the in-plane direction of the film) has the following disadvantages. For a high linear recording density, a smaller space is necessary between the GMR device and each of the magnetic shield films arranged above and below it. This results in a thinner insulator between the GMR device and the shield film, which does not provide sufficient insulation. Moreover, the reduced reproducing track width makes magnetic domain control difficult and produces asymmetric output signals.

By contrast, in the case of a CPP-GMR device, the insulation between the shield films is not important because both sides of the device function as electrodes. Therefore, a CPP-GMR device will be considerably free from thermal breakdown due to current and non-linearity caused by the magnetic field. Moreover, it is promising for use with high recording densities because it will increase in output as the device area decreases. Much has been reported about CPP-GMR devices, typically, in JP (PCT) No. 509956/1999 and JP-A No. 221363/1995.

SUMMARY OF THE INVENTION

Among the promising magnetic reproducing devices, there is a highly sensitive magneto-resistive sensor in which current flows in the thickness direction of the magneto-resistive device. It typically includes CPP-GMR (current-perpendicular to plane GMR) and TMR (tunneling magneto-resistive effect) devices. These magneto-resistive sensors are basically so constructed as to work with the sensing current flowing perpendicularly to the film surface. This leads us to anticipate that the future magnetic reproducing device will be the one which uses the sensing current of a CPP type sensor.

The TMR device is a device which has a pair of magnetic films holding an insulating barrier film between them and in which the sensing current is caused to flow in the thickness direction of the these films. Conduction through the insulating barrier layer presents a high resistance. This poses some problems (such as noise and reduced S/N ratio) when it is used for a reproducing head or a magnetic field sensor. To address these problems, active investigations are going on regarding how to reduce the resistance through the thinning of the insulating barrier layer. Unfortunately, reduction in resistance is accompanied by reduction in output. Another problem with the TMR device is that it increases in resistance as its surface area decreases.

Unlike the TMR device, the CPP-GMR device is constructed such that a pair of magnetic films are disposed on either side of a non-magnetic film, and the current flows in the thickness direction of the films. A CPP-GMR device (with current flowing in the thickness direction of the film) has a shorter current path than that of a CIP-GMR device (with current flowing perpendicularly in the thickness direction of the film). Therefore, the conventional GMR film has a resistance as low as milliohms, even in the case of a device with a surface area of 1 $\mu m^2$. In other words, a CPP-GMR device has too low a resistance to be applied to a magnetic reproducing device. Moreover, the conventional GMR film has a high ratio of resistance change (several percent) in the CPP direction, but it has a very small output on account of the excessively low resistance.

The foregoing considerations have created a demand for a new material which has a proper degree of resistivity and a large GMR output.

There are important problems involved with a CPP-GMR device, as follows. There is a need for:
(1) A new process for manufacturing devices in a smaller size.
(2) A new material and a new film structure which will increase the ratio of change in the magnetic resistance of the device.
(3) A new film structure to control the electric resistance of the device.

The first problem has arisen from the fact that about 0.3×0.3 $\mu m$ is the minimum size of the device that can be manufactured by the current photo-lithography technique which employs an aligner or stepper. In the case where an ordinary GMR film is used for a device of the CPP-GMR type, this size (or device area) has such a low resistance that its output is as small as the limit of measurement. This is because the GMR film is a multi-layered metal film with a thickness of tens of nanometers (which produces an excessively small resistance). Therefore, in the case of a CPP-GMR device, the device should be smaller than 0.1×0.1 µm, or it should be manufactured from a new material which produces an adequate resistance for a certain device area. Reduction in the device area may be accomplished by lithography using the technique of atomic force microcopy or by electron beam lithography. These technologies, however, are still incapable of manufacturing devices smaller than 0.1×0.1 µm.

It is an object of the present invention to provide a magneto-resistive device and any component, such as a magnetic head, a magnetic recording device, and a magnetic memory, which is provided with said magneto-resistive device. This magneto-resistive device has a high ratio of change in resistance in response to an applied magnetic field, an adequately controlled electric resistance, and an increased reproducing output on account of the adequate selection of materials and film structure, which solve the above-mentioned problems (2) and (3), with the device size being reduced as much as possible by using the existing technology.

The first aspect of the present invention resides in a magneto-resistive device having a first magnetic layer, a second magnetic layer, and a non-magnetic spacer formed between said first and second magnetic layers, wherein said first magnetic layer contains a magnetic material whose conduction electrons belong to a first energy band and said second magnetic layer contains a magnetic material whose conduction electrons belong to a second energy band, with said first and second energy bands being attributable to orbitals of the same kind.

The second aspect of the present invention resides in a magneto-resistive device having a first magnetic layer, a second magnetic layer, and a non-magnetic spacer formed between said first and second magnetic layers, wherein at least either of said first magnetic layer and said second magnetic layer contains a magnetic material whose conduction electrons belong to a first energy band and said non-magnetic spacer contains a non-magnetic material whose conduction electrons belong to a second energy band, with said first and second energy bands being attributable to orbitals of the same kind.

The third aspect of the present invention resides in a magneto-resistive device having a first magnetic layer, a second magnetic layer, and a non-magnetic spacer formed between said first and second magnetic layers, wherein said first magnetic layer and said second magnetic layer contain a half-metallic ferromagnetic material or a highly polarized magnetic material.

The fourth aspect of the present invention resides in any component, such as a magnetic head, a magnetic recording device, and a magnetic memory, which is provided with said magneto-resistive device.

The above-mentioned magneto-resistive device, magnetic head, magnetic recording device, and magnetic memory are characterized by a high ratio of change in resistance in response to an applied magnetic field, an adequately controlled electrical resistance, and an increased output, which result from the adequate film structure and adequate material selection for the magneto-resistive device.

BRIEF DESCRIPTION OF THE DRAWINGS

FIG. 2 is a graph showing the dependence on temperature of the saturation magnetization of $Fe_3O_4$ film formed on a noble metal film (Au);

FIG. 18 is a diagram showing the structure of the CPP-GMR to which the present invention is applied;

DETAILED DESCRIPTION OF THE PREFERRED EMBODIMENTS

The following is a detailed description of the magneto-resistive device, magnetic head, magnetic recording unit, and magnetic memory to which the present invention is applied.

The magnetic head according to the present invention is provided with a magneto-resistive device having a first magnetic layer (free layer), a second magnetic layer (pinned layer), and a spacer interposed between said first and second magnetic layers.

The magneto-resistive device may be one which has an anti-ferromagnetic layer, a soft magnetic layer, and a noble metal layer, said anti-ferromagnetic layer being formed on the surface opposite to that surface facing the spacer of the second magnetic layer, said soft magnetic layer being formed between the pinned layer and said anti-ferromagnetic layer, and said noble metal layer being formed between the pinned layer and said soft magnetic layer.

The pinned layer and free layer each contain at least one species of Heusler alloys and half-metals (any of $Fe_3O_4$, $CrO_2$, and ZnO which is incorporated with a transition metal). The first feature of this magneto-resistive device is that its spacer has a half-metal arranged on both sides thereof.

Figure 1A:
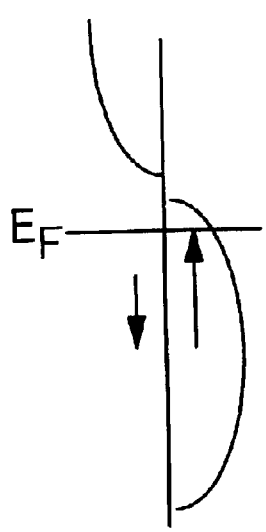
FIGS. 1A to 1C are diagrams showing the state of electron density (DOS)

A "half-metal" is a material which is characterized by its electron structure, as shown in FIG. 1A. The electron structure will be briefly described in the following. Incidentally, FIGS. 1A, 1B and 1C show the electron density state of a half-metal magnetic material, a non-magnetic metal, and a magnetic metal, respectively.

Figure 1B:
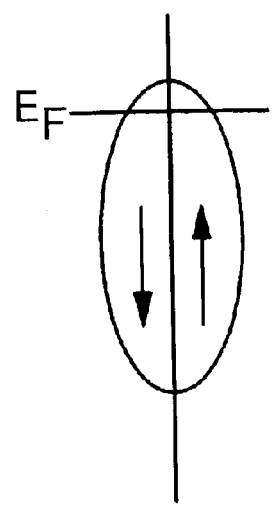
Figure 1C:
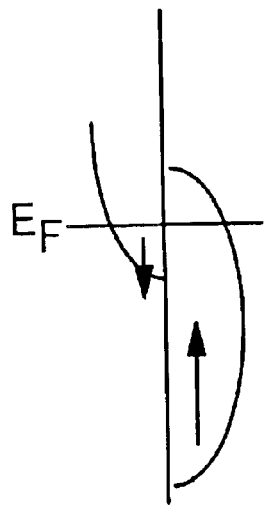

In general, a metal (non-magnetic) takes on the electron structure as shown in FIG. 1B. This diagram shows that the energy level changes from the low (stable) state to the high state in going upward. In these figures, the horizontal axis represents the electron density, with the center being zero. The right-hand and left-hand sides, as shown in FIG. 1B, which are separated by the center line, indicate that electrons have two kinds of electron spin. For convenience's sake, the right-hand side denotes an up spin (↑) and the left-hand side denotes a down spin (↓).

The energy level $E_F$ in the diagram denotes the Fermi surface, electrons in which are largely responsible for electric conduction. A metal has an electron density in the Fermi surface, in which there are free electrons which conduct electricity. A half-metal is a substance characterized in that electrons in the Fermi surface have either an up spin or a down spin.

The electron spin closely relates to the magnetic properties. A magnetic material is characterized by the fact that the total number of electrons in the band under the Fermi surface greatly varies depending on whether the electrons are those of an up spin or a down spin. By contrast, a half-metal material is characterized by the fact that all electrons in the Fermi surface are those of a polarized spin.

Consequently, there really exists materials which behave as both a half-metal and a ferromagnet. They are commonly called a half-metal magnetic material; however, they are collectively referred to as a half-metal hereinafter because many half-metals are magnetic materials. The deviation of spin is referred to as polarizability (P). It is represented by the formula (1) below, wherein n↑ denotes the number of up spin electrons at the Fermi surface and n↓ denotes the number of down spin electrons at the Fermi surface.

$$P = 100 \times (n\uparrow - n\downarrow)/(n\uparrow + n\downarrow) \qquad (1)$$

What occurs in a half-metal under the application of a current is that those electrons having the same spin components as the direction of electron spin of the half-metal conduct through the half-metal, but those electrons having a spin in the opposite direction do not conduct due to a repulsion force. This suggests that the spin valve structure consisting of a half-metal magnetic material and a metal magnetic material joined together, with a non-magnetic metal interposed between them, would greatly change in resistance in response to an applied magnetic field when the magnetization of the metal magnetic film is reversed by an external magnetic field, if the metal magnetic material is formed from a soft magnetic material.

It is considered in principle that the spin valve structure as mentioned above will change in resistance infinitely if the half-metal magnetic material has a 100% polarizability. Therefore, it is expected that a spin valve structure with a half-metal magnetic material will give an increased output owing to an increased ratio of change in resistance.

Actually, the change in resistance is finite because the band, to which the electrons existing on the Fermi surface belong, governs the efficiency of electron conduction to other substances. More specifically, electrons divide into groups according to their angular momenta and orbitals (such as 1s, 2p, and 3d), each group being referred to as a band. When two materials are joined together, electron conduction does not take place efficiently, if there are s-electrons and d-electrons, respectively, at the Fermi surface, because the spin information passes from the s-electrons to the d-electrons through a few s-electrons and other complex routes (with reflection) rather than directly. In addition, if the two materials differ extremely in resistance, an appreciable loss due to reflection occurs because the flow of electrons is inhibited.

The film structure with an interface is identical with that of a GMR film. If a combination of adequate materials is selected such that electron conduction is maximum at the interface between the pinned layer and the space, or at the interface between the spacer and the free layer, then an increased ratio of change in resistance can be expected.

The above-mentioned half-metal magnetic materials fall under three major categories: magnetic semiconductors, part of oxide magnetic materials, and Heusler alloys.

Magnetic semiconductors include CrAs, CrSb, and dilute magnetic semiconductors (such as InMaAs and GaMnAs). The last one is formed from a III–V compound semiconductor with a crystal structure of zinc blende type by doping with a magnetic material such as Mn. They are prepared in single-crystal form by molecular beam epitaxy (MBE).

Magnetic semiconductors usually behave like a half-metal at low temperatures (below 10K). However, those of ZnO and GaN doped with a transition metal and those having a crystal structure of zinc blende type exhibit ferromagnetic properties at room temperature. They belong to the category of a half-metal. There are some exceptions; for example, CrSb and CrAs exhibit magnetic properties at high temperatures (~350K and Tc>1000K, respectively).

A well-known example of oxide magnetic materials is $Fe_3O_4$. Other examples include $CrO_2$ and LaSrMnO, which can be used as half-metal materials. $Fe_3O_4$ is important because it exhibits half-metal characteristics at room temperature, and it is a soft magnetic material that is capable of significant magnetization. Nevertheless, it has never been put to practical use, because it needs high temperatures (exceeding 500° C.) if it is to be obtained in the form of a single-layer film on a single crystal substrate.

Oxide half-metal magnetic materials have never been made into an actual magnetic head (or other devices) because they have to be processed at high temperatures. In addition, $Fe_3O_4$ tends to form a multiple phase with $Fe_2O_3$ and Fe. The former is stable and similar to $Fe_3O_4$ in composition, but is not a half-metal with a weak tendency toward magnetization. $CrO_2$ also readily mixes with $Cr_2O_3$, which is an insulating material, and hence needs a special process at high temperatures in an oxygen atmosphere.

It is possible to form a single phase of $Fe_3O_4$ by controlling its growing energy. All that is required to achieve this object is to form a noble metal film on a substrate by RF sputtering and then form $Fe_3O_4$ on it. This process gives rise to a film on a substrate kept at 300° C. The resulting film is known to be a single layer of $Fe_3O_4$ from its X-ray diffraction pattern. Its saturation magnetization at room temperature is 0.55–0.6 tesla, which is similar to that of bulk $Fe_3O_4$ (0.5–0.6 tesla). It also exhibits Verwey transition (anomalous temperature dependence of saturation magnetization at about 120K) which is characteristic of $Fe_3O_4$. Almost the same phenomena as mentioned above are noticed in the film formed on a substrate at 250° C. or above. Any film formed on a substrate at 150–200° C. exhibits saturation magnetization greater than 0.5 tesla. These facts suggest that the above-mentioned process can yield a single-phase film of $Fe_3O_4$ which is as thin as several nanometers.

Heusler alloy is unique in its structure represented by $Cu_2MnAl$. It is renowned for its ferromagnetism resulting from localized magnetic moment in regularly arranged Mn atoms. In general, it exhibits high ferromagnetism and high Tc when its component is partly replaced. For example, replacement of Cu gives $(MMn)_2Al_2$ (where M denotes Cu, Ni, Co, or Fe) and replacement of Al by Si, Sn, or Ge gives $Cu_2MnSi$ or the like. Its magnetism arises from d-electrons of Mn, and its conductivity is attributable to s-electrons and d-electrons. It is completely polarized by the long-range mutual action by d-electrons of Mn. This is a probable reason why it behaves as a half-metal. The above-mentioned materials can be formed by molecular beam epitaxy or sputtering on a substrate at 300° C. The resulting product can be made completely regular by prolonged heat treatment at 500–800° C.

What is important here is the comparison of magnetoresistive effect between two different structures. One structure is formed by joining together a magnetic film containing a half-metal magnetic material and a magnetic film containing a magnetic material containing a half-metal, with a spacer interposed between them. The other structure is formed by joining together a magnetic film containing a half-metal magnetic material and a magnetic film containing another magnetic material, with a spacer interposed between them. Calculations were carried out in consideration of bonding and electron transport at the interface. The results are as follows.

(1) Change in resistance in response to an applied magnetic field is positive or negative, if one magnetic film has a CPP-GMR structure of a d-electron half-metal, the spacer has s-electrons, and the other magnetic film has s-electrons.

(2) Change in resistance in response to an applied magnetic field is positive, if one magnetic film has a CPP-GMR structure of a d-electron half-metal, the spacer has d-electrons, and the other magnetic film has s-electrons.

(3) Change in resistance in response to an applied magnetic field is positive (nearly 100%), if one magnetic film has a CPP-GMR structure of a d-electron half-metal, the spacer has s-electrons, and the other magnetic film has d-electrons. However, loss due to reflection and scattering is large because of the small number of electrons.

(4) Change in resistance in response to an applied magnetic field is small, or a balance occurs between (1) and (3), if one magnetic film has a CPP-GMR structure of a d-electron half-metal, the spacer has s-electrons, and the other magnetic film has s-electrons and d-electrons.

(5) Change in resistance in response to an applied magnetic field is equal to the balance between (1) and (2), if one magnetic film has a CPP-GMR structure of a d-electron half-metal, the spacer has s-electrons and d-electrons, and the other magnetic film has s-electrons.

(6) Change in resistance in response to an applied magnetic field is nearly 100%, if one magnetic film has a CPP-GMR structure of a d-electron half-metal, the spacer has d-electrons and the other magnetic film has d-electrons.

The foregoing suggests that the spacer and free layer will have the optimal electron state if adequate materials are specified on the basis of electron species at the Fermi surface.

In the case of an ordinary $Fe_3O_4$/Au/NiFe structure, the $Fe_3O_4$ layer has d-electrons constituting the Fermi surface, the Au layer has s-electrons, and the NiFe layer has s-electrons and d-electrons which are mixed up. This structure corresponds to the result (4) mentioned above, and it gives a small ratio of change in resistance in response to an applied magnetic field ($\Delta R/R$).

By contrast, there is another possible structure in which the free layer is formed from Fe in place of NiFe. Since Fe has a large d-electron density at the Fermi surface, this structure is similar to the result (2) mentioned above, and it gives a higher $\Delta R/R$. Moreover, another structure, in which the free layer is formed from $Fe_3O_4$ (half-metal having 100% d-electrons) in place of NiFe, also gives a higher $\Delta R/R$.

Further, another structure in which Au for the spacer is replaced by Pt having d-electrons at the Fermi surface is also expected to give a higher $\Delta R/R$. Moreover, there is another possible structure in which Au for the spacer is replaced by an oxide semiconductor (such as $TiO_2$) having d-electrons at the Fermi surface. This structure corresponds to the result (6) mentioned above, and it will give a very high $\Delta R/R$. The device with this structure is composed of layers each having almost the same resistivity, and, hence, it will suffer a minimum reflection loss due to impedance mismatch.

In a magnetoresistive device, the half-metal magnetic material constitutes a magnetic film adjacent to the free layer and the pinned layer. The pinned layer has its magnetization fixed by the antiferromagnetic coupling which is applied to the ordinary GMR reproducing head. In this case, the antiferromagnetic film should be formed on a metal magnetic film of NiFe or the like as an underlying layer. If a metal magnetic film or an antiferromagnetic film is formed on an oxide magnetic film, oxygen diffuses into the metal magnetic film from the oxide magnetic material (half-metal magnetic material). This oxygen diffusion deteriorates the half-metal and metal magnetic film, thereby decreasing the reliability.

Instead of the conventional structure mentioned above, the present invention adopts a new structure in which an anti-ferromagnetic film and an oxide magnetic film (half-metal) are bonded together with a synthetic ferromagnetic structure interposed between them. This new structure greatly improves the reliability because the ferromagnetic spacer (noble metal film) prevents oxidation regardless of whether it is above or below the anti-ferromagnetic film. This structure is new in that the synthetic ferromagnetic bond is formed between a metal magnetic film and an oxide magnetic film.

Incidentally, the anti-ferromagnetic film may be formed from such a material as MnPt, CrMnPt, PdMnPt, and MnIr.

A promising way to control magnetic domains is to use a closed flux structure (CFS) or a hard bias structure. The former consists of a free layer, a non-magnetic spacer, a soft magnetic film, and an anti-ferromagnetic film, which are formed sequentially, one over the other. (The non-magnetic spacer is formed on that surface of the free layer which is opposite to the surface in contact with the spacer.) A device having this structure prevents the occurrence of magnetic domains, because the magnetic pole appearing at the end of the soft magnetic film and the magnetic pole appearing at the end of the free layer cancel each other out through static magnetic coupling. This effect becomes more salient as the device area decreases. (Devices with a large area are affected by in-plane coupling.)

The hard bias structure is provided with a permanent magnet such that the magnetic pole at the end of the permanent magnet prevents magnetic domains from occurring in the free layer. (The permanent magnet is arranged such that it is in contact with the device in its section that is cut in the track width direction of the device.) This structure has been in practical use to a certain extent. A problem inherent in this structure is that the permanent magnet needs to be in contact with the device accurately and symmetrically. However, it is difficult to maintain accuracy and control the magnetic domains as the device area decreases.

EXAMPLE 1

A magnetic film containing $Fe_3O_4$ as a half-metal magnetic material was formed by RF sputtering on a substrate of glass, magnesium oxide, GaAs, AlTiC, SiC, $Al_2O_3$, $SiO_2$, or the like.

The RF sputtering was carried out under the following conditions:
Target: sintered body of $Fe_3O_4$
Atmosphere: argon at about 1–0.1 Pa
Power: 50–150 W
Maximum degree of vacuum achieved: lower than $5\times10^{-3}$ Pa
Rate of film growth: less than 0.1 Å/s It was found that the $Fe_3O_4$ film can also be formed very slowly at a growth rate of 0.1–0.01 Å/s by molecular beam epitaxy (MBE), with oxygen being admitted into the atmosphere while Fe is being deposited.

The $Fe_3O_4$ film formed directly on the above-mentioned substrate varies in saturation magnetization depending on the substrate temperate, from less than 0.1 tesla (at room temperature) to 0.2–0.3 tesla (at 400° C.). These values are rather low for the single layer of $Fe_3O_4$.

The $Fe_3O_4$ film formed in this manner was found to be strongly amorphous. In order to make the amorphous film into a nearly complete single-layer film, it is usually necessary to raise the substrate temperature above 540° C. to promote crystallization. However, the present inventors succeeded in forming a $Fe_3O_4$ film (10–50 nm thick) having a saturation magnetization higher than 0.4 tesla on a single-crystal substrate at 250° C. or above by a newly developed sputtering method. This method is characterized by a reduced $H_2O$ fraction ratio in the sputtering chamber and a low growth rate and a low energy.

Figure 3:
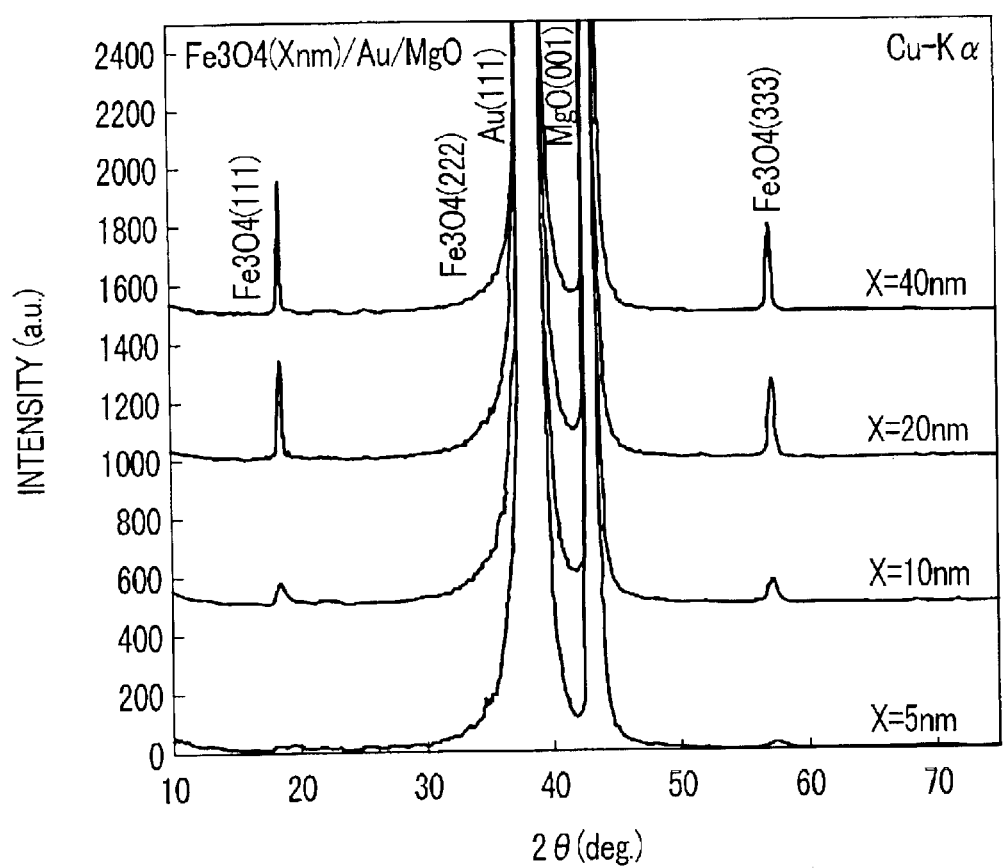
FIG. 3 is a graph showing the dependence on film thickness of the X-ray diffraction pattern of $Fe_3O_4$ film formed on a noble metal film (Au)

The resulting film exhibited a temperature dependence of resistance, which is similar to that of a semiconductor at high temperatures above 120K, as shown in FIG. 2. The curve indicates the pressure of a Verwey transition in the vicinity of 120K, which is a phenomenon characteristic of $Fe_3O_4$ (transition into an insulator). Moreover, the resulting film gave X-ray diffraction patterns as shown FIG. 3, which are attributable to $Fe_3O_4$. The $Fe_3O_4$ obtained in this manner is known to have half-metallic characteristics theoretically and from the past spectroscopic analyses. It has been confirmed that this material remains crystalline until the film thickness reaches 5 nm.

Figure 4:
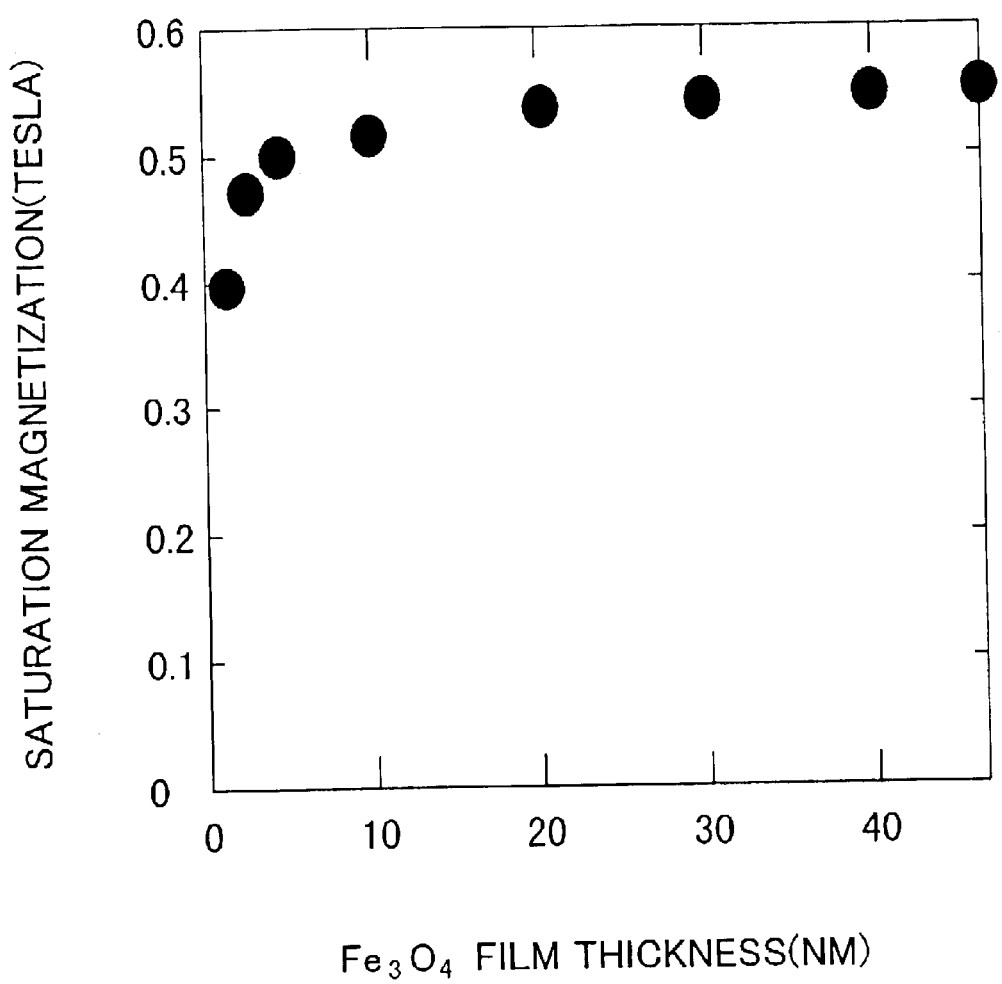
FIG. 4 is a graph showing the dependence on film thickness of the saturation magnetization of $Fe_3O_4$ film formed on a noble metal film (Au)

The $Fe_3O_4$ film has a thickness dependence of saturation magnetization as shown in FIG. 4. It is noted from FIG. 4 that the saturation magnetization tends to decrease rapidly as the film thickness decreases. However, a film as thin as about 1 nm still remains magnetized. The saturation magnetization decreased from about 0.5 tesla (for the film thickness larger than 10 nm) to about 0.4 tesla (for the film thickness smaller than 0.8 nm). This suggests that even such a thin film still keeps the ferromagnetic properties characteristic of magnetite. An excessively thin film does not suit the needs of a magnetic reproducing head because it abruptly changes in characteristic properties.

A magnetic film containing half-metal $Fe_3O_4$ was formed on a substrate, with an underlying layer of noble metal interposed between them.

If half-metal $Fe_3O_4$ is to be applied to the magnetoresistive device of the magnetic reproducing head, it is necessary to provide a conductive film (which functions as both an electrode and an underlying layer) to the lower part of the device. An adequate underlying film is expected to lower the growth temperature. So, a noble metal film, 2 nm thick, was formed on the above-mentioned substrate from each of Pt, Pd, Rh, Ru, Ir, Au, Ag, and Cu. On the noble metal film, a $Fe_3O_4$ film, 50 nm thick, was formed by the above-mentioned method. The resulting sample was tested for the temperature dependence of magnetic properties. All of the samples were found to be satisfactory. Particularly, the $Fe_3O_4$ film formed on the underlying film of Au, Pd, or Pt exhibited a saturation magnetization of about 0.5 tesla even though the substrate temperature was as low as 200° C. In addition, this $Fe_3O_4$ film has a coercive force of about 1 A/m which proves it to be a good soft magnetic film.

The underlying noble metal film may be made thicker (50–100 nm) than mentioned above. In this case, the same value mentioned above can be obtained if the surface roughness (Ra) is reduced to 0.4 nm or below. Moreover, it is also possible to form the noble metal layer on an underlying layer of Cr or Ta (about 5–50 nm thick). This underlying layer smoothens the noble metal layer formed thereon, and the smooth surface helps the $Fe_3O_4$ film to grow thereon.

The half-metal film to be applied to the reproducing head should exhibit the above-mentioned characteristic properties when it is about 1 nm thick. The problem with a reduction in the film thickness is that thermal energy dominates over magnetic energy due to the magnetic spin in the magnetic particles constituting the film. Thus, the film becomes super-paramagnetic, with random directions of magnetization. Therefore, the half-metal film should be thicker than the critical thickness at which it becomes super-paramagnetic. The pinned layer may maintain its magnetization characteristics if the thin half-metal layer is magnetized by an anti-ferromagnetic film or a ferromagnetic film in contact therewith.

A film of oxide half-metal was grown from $CrO_2$, ZnO, or GaN (in place of $Fe_3O_4$) on an underlying noble metal film in the same way as mentioned above. It was found that a single-layer film grew even on a substrate at 250° C. ZnO behaves like a ferromagnetic half-metal when it is doped with a ferromagnetic metal, such as V, Cr, Fe, Co, and Ni, as much as 25%. Likewise, GaN also behaves like a ferromagnetic half-metal when it is doped with Mn, as much as 25%. These materials can also be made into a film on an underlying noble metal film.

Heusler alloy is a material which has a characteristic structure of $Cu_2MnAl$. It is renowned for ferromagnetism due to a magnetic moment localized in the Mn atoms in its regular state. It is usually used in a substituted form, such as $(MMn)_2Al_2$ (where M denotes Cu, Ni, Co, or Fe) and $Cu_2MnSi$ (with Al replaced by Si, Sn, or Ge). The substituted one has a high Tc and exhibits strong magnetism. This magnetism is due to d-electrons of Mn. Conduction electrons are s-electrons and p-electrons. They are completely polarized by the long-range mutual action by d-electrons of Mn. This is a probable reason why it behaves like a half-metal. The substituted Heusler alloy can be made into a film on a substrate at 200–300° C. by MBE or sputtering. The resulting film can be made completely regular by prolonged heat treatment at 500–800° C.

EXAMPLE 2

Figure 5:
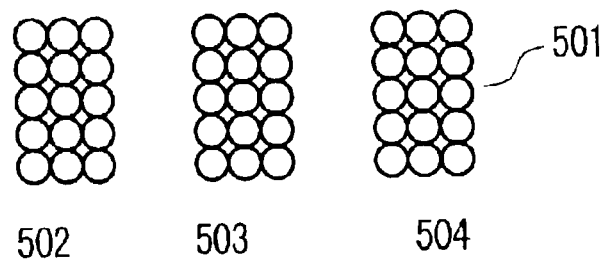
FIG. 5 is a diagram which visualizes the model of the device structure used to calculate the ratio of change in resistance.

It is important to see if an improvement is made over the conventional GMR in magnetoresistance effect when a half-metal material is bonded to another magnetic material, with a spacer interposed between them. This problem was attacked by calculating the bond at the interface with the help of a model based on electron transport. As shown in FIG. 5, the model consists of $Fe_3O_4$ (502), spacer (503), and CoFe (504) in consideration of the fact that electrons greatly transmit from one electron orbital to another. (In this model, s-electrons are assumed for 503 and 504.) The interface state density $D_{L(R)}$ in the left (right) electrode is represented by the formula (2) below, in which C denotes conductance and T denotes transmission rate.

$$C = T\, D_L D_R \quad (2)$$

Figure 6:
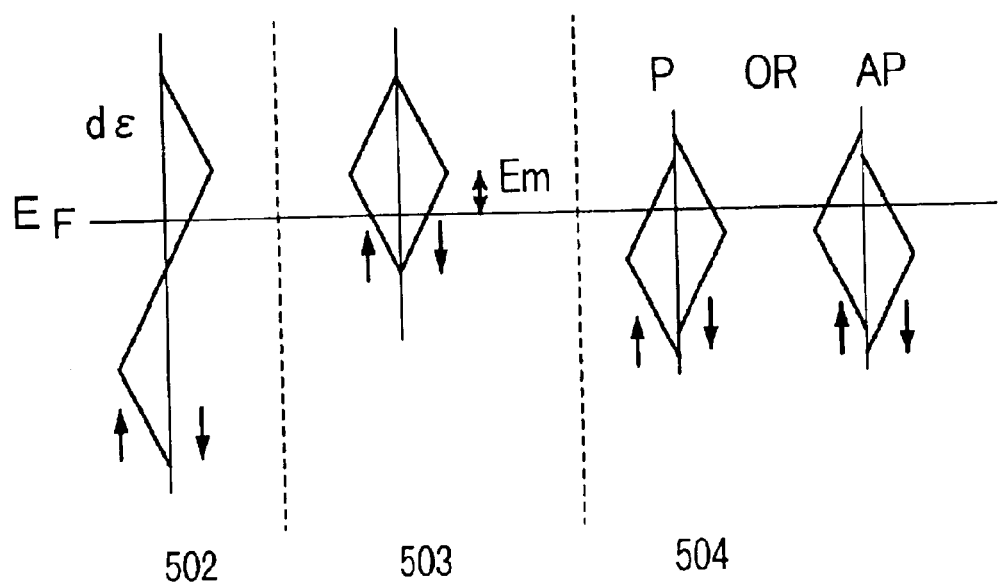
FIG. 6 is a diagram modeling the electron state in each layer which was used to calculate the ratio of change in resistance.

In this model, the electron state is assumed to have the junction of electron density distribution as shown in FIG. 6. This electron density distribution is based on the simplified result obtained from band calculations by the first principle and local density functional formalism. The results are as follows.

Figure 7:
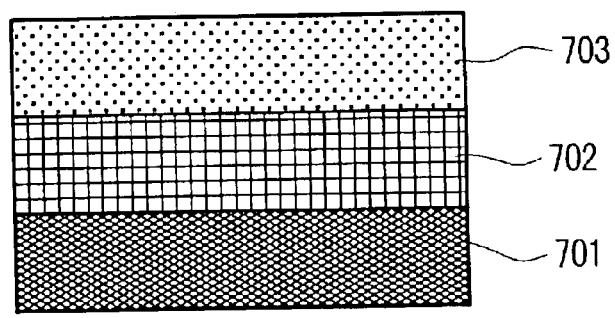
FIG. 7 is a diagram showing a magneto-resistive device for which calculations were performed according to the present invention.

(1) Change in resistance in response to an applied magnetic field is positive or negative in the case of a model consisting of one magnetic film of CPP-GMR structure of a d-electron conductive half-metal (701), an s-electron conductive spacer (702), and another magnetic film of s-electron conductive half-metal (703), as shown in FIG. 7.

Figure 8:
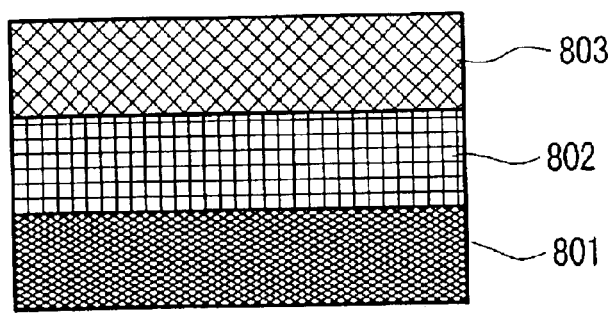
FIG. 8 is a diagram showing a magneto-resistive device for which calculations were performed according to the present invention.

(2) Change in resistance in response to an applied magnetic field is positive in the case of a model consisting of one magnetic film of CPP-GMR structure of a d-electron conductive half-metal (801), a d-electron conductive spacer (802), and another magnetic film of s-electron conductive half-metal (803), as shown in FIG. 8.

Figure 9:
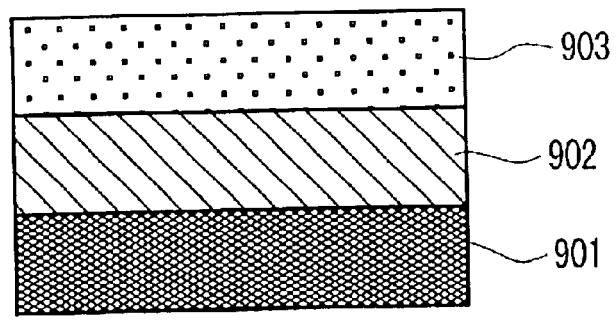
FIG. 9 is a diagram showing a magneto-resistive device for which calculations were performed according to the present invention.

(3) Change in resistance in response to an applied magnetic field is positive (nearly 100%) in the case of a model consisting of one magnetic film of CPP-GMR structure of d-electron conductive half-metal (901), an s-electron conductive spacer (902), and another magnetic film of d-electron conductive half-metal (903), as shown in FIG. 9. However, loss due to reflection and scattering is large because of the small number of electrons.

Figure 10:
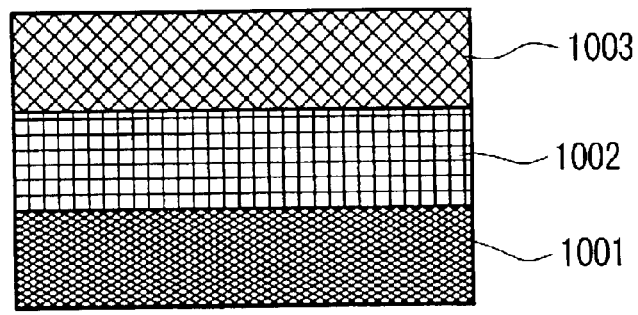
FIG. 10 is a diagram showing a magneto-resistive device for which calculations were performed according to the present invention.

(4) Change in resistance in response to an applied magnetic field is small, or a balance occurs between (1) and (3), in the case of a model consisting of one magnetic film of CPP-GMR structure of a d-electron conductive half-metal (1001), an s-electron conductive spacer (1002), and another magnetic film of s- and d-electron conductive half-metal (1003) (in which there are both s-electrons and d-electrons), as shown in FIG. 10.

Figure 11:
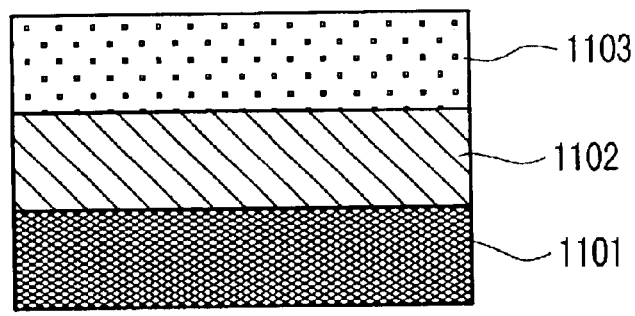
FIG. 11 is a diagram showing a magneto-resistive device for which calculations were performed according to the present invention.

(5) Change in resistance in response to an applied magnetic field is small, or a balance occurs between (1) and (2), in the case of a model consisting of one magnetic film of CPP-GMR structure of a d-electron conductive half-metal (1101), an s- and d-electron conductive spacer (1102), and another magnetic film of s-electron conductive half-metal (1103), as shown in FIG. 11.

Figure 12:
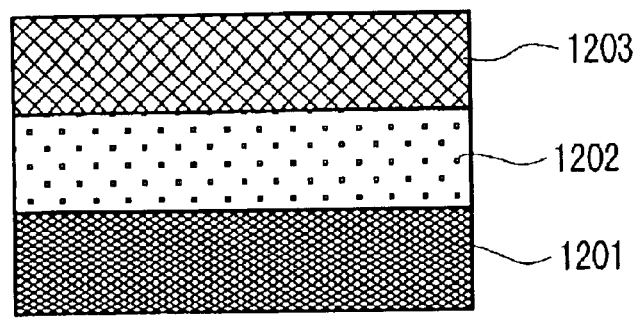
FIG. 12 is a diagram showing a magneto-resistive device for which calculations were performed according to the present invention.

(6) Change in resistance in response to an applied magnetic field is nearly 100% in the case of a model consisting of one magnetic film of CPP-GMR structure of a d-electron conductive half-metal (1201), a d-electron conductive spacer (1202), and another magnetic film of d-electron conductive half-metal (1203), as shown in FIG. 12.

Figure 13:
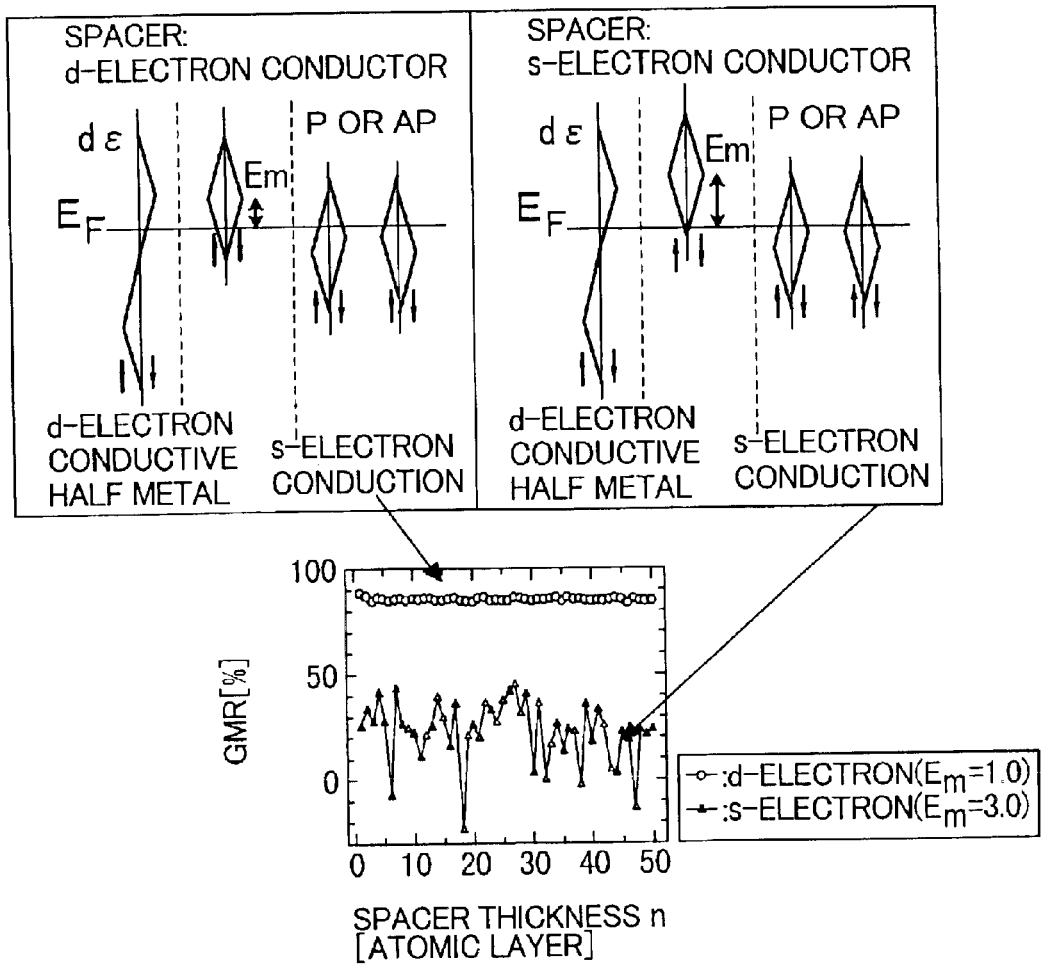
FIG. 13 is a diagram showing the magneto-resistive device of the present invention and also showing the result of calculations.

More specifically, in the case of (1), a change in magnetoresistance is expected which corresponds to the curve representing the s-electron conductive spacer, as shown in FIG. 13. This change fluctuates in the positive or negative direction depending on the thickness of the spacer. Calculated ratios of change in magnetoresistance are also as low as about ±30%.

By contrast, in the case of (2), the change in magnetoresistance is positive, which corresponds to the curve representing the d-electron conductive spacer, as shown in FIG. 13. The ratio of change in magnetoresistance is close to 90%. The actual value, however, is smaller than this, but is still large, because the electron density of the spacer is low, and there is impedance between the magnetic film and the spacer.

Figure 14:
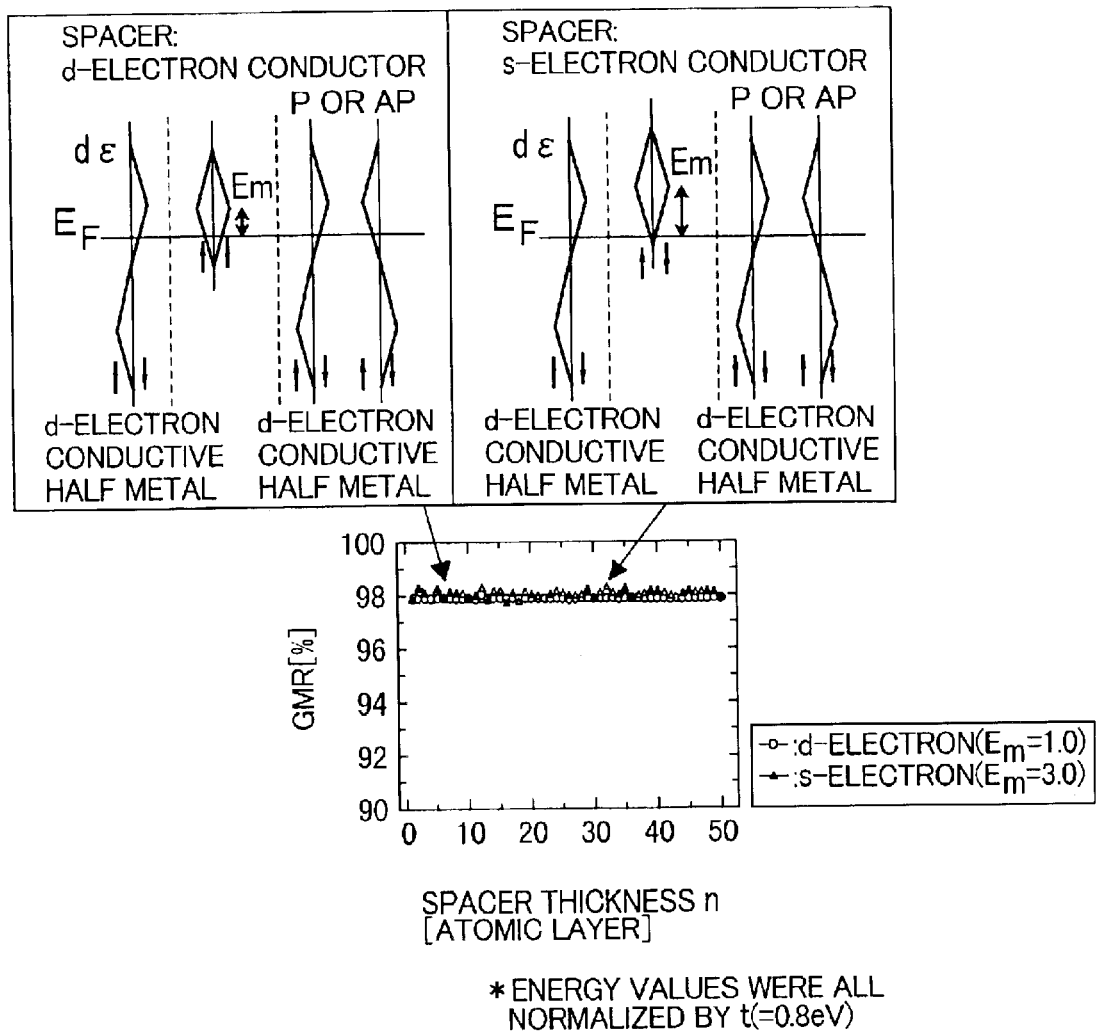
FIG. 14 is a diagram showing the magneto-resistive device of the present invention and also showing the result of calculations.

The structure in (3) exhibits a high GMR even though it consists of a d-electron half-metal film, s-electron spacer, and d-electron film, as shown in FIG. 14. The actual value, however, is smaller than this owing to the impedance.

Each of (4) and (5) is a hybrid of (1) and (2) or a hybrid of (1) and (3). Calculated values suggest that these structures also give a higher ratio of change in magnetoresistance than the conventional ones. The actual ratio of change in magnetoresistance will be smaller than the calculated one because it is strongly affected by s-electrons in many cases and it is the balance between respective values or smaller than them.

The structure of (6), which consists of a d-electron half-metal film, a d-electron spacer, and a d-electron film, which are bonded together by d-electrons, gives a high ratio of change in magnetoresistance (nearly 100%), as indicated by the curve representing the d-electron conductive spacer, as shown in FIG. 14. In this situation, the cross between the spacer and the Fermi surface is large, and the electron density is high. In addition, the d-electron conductor is usually a high-resistance material like an oxide semiconductor; this leads to good impedance coupling and low reflection loss. Therefore, this structure is most adequate. The foregoing results and attendant considerations suggest that the electron state in the spacer and free layer may be optimized if an adequate material is specified on the basis of electron species at the Fermi surface.

It is concluded from the foregoing that a half-metal, such as $Fe_3O_4$ which has d-electrons in the electron state of the Fermi surface, should be used in such a way that (A) the counter magnetic material is that of d-electrons (or the counter magnetic material is the one in which d-electrons are major conduction electrons) or (B) the spacer is replaced by a d-electron conductive material.

The d-electron material designated by (A) above possibly includes, as ordinary magnetic materials, Fe and Fe-containing 3d ferromagnetic compound FeX (where X is at least any one of Ni, Co, C, N, and O) with an Fe content being more than 50%. Fe is characterized by the fact that 3d-electrons and s-electrons are hybridized at the Fermi surface, whereas the compound in which Ni and Co predominate is characterized by the fact that 3d-electrons and s-electrons have a spin in the mutually opposite direction and d-electrons have a spin in the downward direction. This leads to a low magnetoresistance.

$Fe_3O_4$, $CrO_2$, or LaSrMnO as a d-electron half-metal material is a d-electron half-metal magnetic material. Such half metal relies for conduction on 100% polarized electrons and is useful as the material designated by (A) above. It is known that $Fe_3O_4$ has downward d-electrons constituting the Fermi surface.

Heusler alloys as a half-metal other than those mentioned above does not produce a good effect expected from a d-electron material because it has s-electrons and p-electrons which are coupled at the Fermi surface. A magnetic semiconductor such as CrAs is effective because it has d-electrons as major electrons at the Fermi surface. A dilute magnetic semiconductor (such as GaMnAs) and ZnO, in which d-electrons and p-electrons are hybridized at the Fermi level, is expected to produce an effect at the part which is bonded with d-electrons.

A noble metal, such as Pt, Au, Pd, Ag, Cu, Rh, and Ru, used for the spacer relies for conduction on s-electrons, but is useful for the s-electron spacers other than that mentioned in (5) above. Such a noble metal as Pt, Pd, and Ag has a large number of d-electron states in the vicinity of the Fermi surface, and, hence, it readily forms a d-electron bond. Thus, it is expected to produce an effect as a d-electron spacer. Other spacer materials, such as SrTiO (perovskit-type oxide) and $TiO_2$ (rutile-type oxide) have a high d-electron density as the electron state at the Fermi surface. It is known from calculations and actual measurement by photoelectron spectrum that $TiO_2$ has the dε orbital appearing at the Fermi surface. The fact that SrTiO also relies for conduction on d-electrons is known from its behavior (change in polarity), which is observed when it is used as the spacer of a TMR device.

Figure 15:
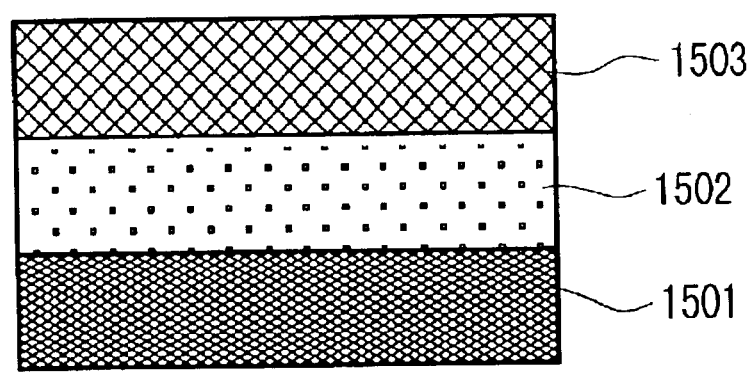
FIG. 15 is a diagram showing a magneto-resistive device for which calculations were performed according to the present invention.

FIG. 15 shows the structure in which the first magnetic layer is formed from a s-electron half-metal (1501). The structure in which the spacer (1502) and magnetic layer (1503) are joined together with an s-electron conductor is effective. A Heusler alloy or a material containing Ni or Co in a large amount is effective for the second magnetic layer, and a noble metal s-electron conductive material (such as Pt, Au, Pd, Ag, Cu, Rh, and Ru) is effective for the spacer.

Figure 16:
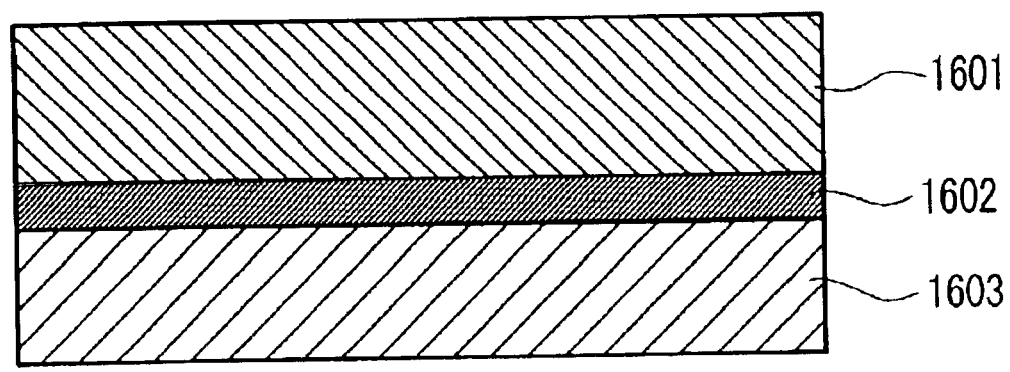
FIG. 16 is a diagram showing the basic structure of the magneto-resistive device.

The conventional GMR device of the spin valve type has a multi-layered structure which consists of at least a free layer (1601), a spacer (1602), and a pinned layer (1603), as shown in FIG. 16.

Figure 17:
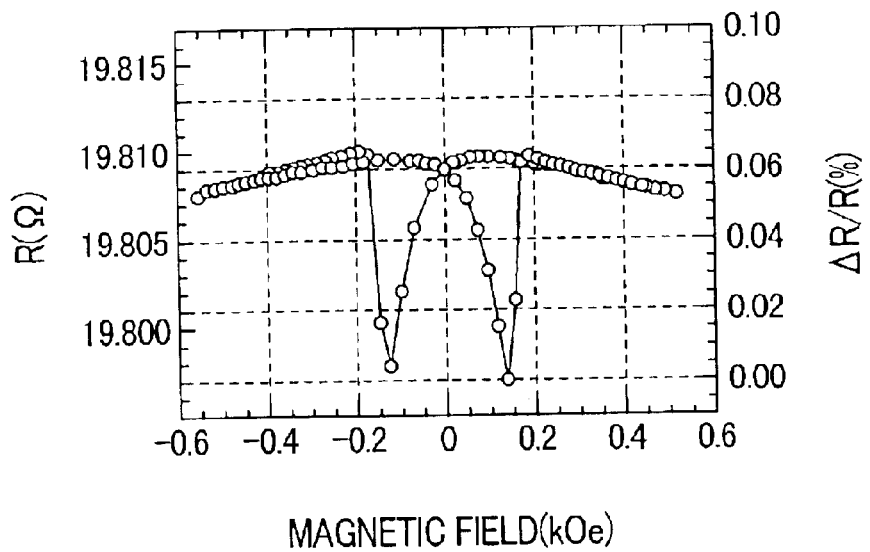
FIG. 17 is a graph showing the result of the measurements carried out for the magneto-resistive device of the present invention.

FIG. 17 shows the state of CIP-GMR composed of $Fe_3O_4$ (40 nm), Au (5 nm), and NiFe (5 nm) sequentially formed on a substrate. It is noted that the substrate/$Fe_3O_4$/Pt/NiFe produces a downwardly convex negative GMR. The ordinary substrate/CoFe/Cu/CoFe structure produces a positive GMR. This polarity relates with conduction electrons in the magnetic layer and spacer. $Fe_3O_4$ is a d-electron conductive material, Au is an s-electron conductive material, and NiFe is a material in which s-electrons and d-electrons are hybridized. It is anticipated that the combination of d/s/s+d will become a mixture of positive GMR and negative GMR. This anticipation has been proved by actual results. The substrate/CoFe/Cu/CoFe structure (which is a combination of s/s/s) produces a positive GMR. If the spacer is formed from Pt, the resulting structure produces a positive GMR because Pt has more d-electron states than Au, and, hence, it relies for conduction more on d-electrons, with the result that components due to a combination of d/s/s+d appear. Likewise, the substrate/$Fe_3O_4$/Pt/NiFe structure is almost twice as large as the substrate/$Fe_3O_4$/Au/NiFe structure in GMR values.

Figure 19:
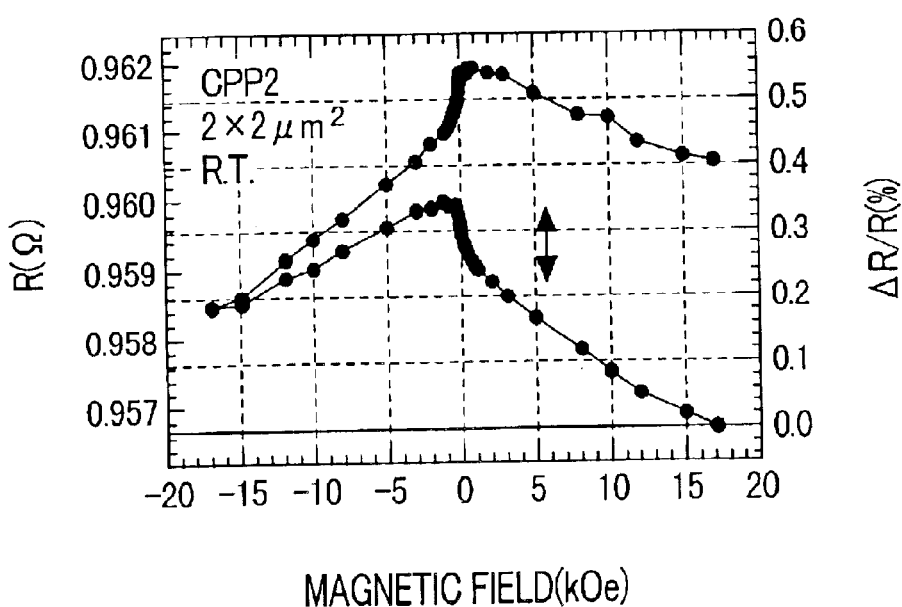
FIG. 19 is a graph showing the result of the measurements carried out for the magneto-resistive device of the present invention.

On the other hand, CPP-GMR is composed of a substrate (1801), a lower electrode (1802), a pinned layer (1803), a spacer (1804), a free layer (1805), a protective film (1806), and electrodes (1808), as shown in FIG. 18. The upper electrode and the lower electrode are isolated from each other by an insulating film (1807). The pinned layer (1803), spacer (1804), and free layer (1805) may be positioned such that the antiferromagnetic film is either above or below in the structure of the GMR device to be mentioned later. The lower electrode (1802) is formed from a material containing at least any one of Au, Cu, NiFe, Cr, and Ru. The structure composed of a substrate, Au (100 nm), $Fe_3O_4$ (40 nm), Au (5 nm), and NiFe (5 nm) produces the CPP-GMR characteristics as shown in FIG. 19.

If the counter free layer is formed from Fe in place of NiFe, then the film structure is similar to that shown in FIG. 8. The structure composed of a substrate, Au, $Fe_3O_4$ (40 nm), Au (5 nm), and Fe (2.5 nm) produces a ratio of change in CPP-GMR greater than 0.2%, which is more than twice as large as that of the structure composed of a substrate, Au, $Fe_3O_4$, Au, and NiFe. Also, the structure composed of a substrate, $Fe_3O_4$ (40 nm), Au (5 nm), and $Fe_3O_4$ (10 nm) produces an improved GMR (greater than twice). The structure composed of a substrate, $Fe_3O_4$ (40 nm), Pt (5 nm), $Fe_3O_4$ (10 nm), in which the material for the spacer is changed and the upper and lower magnetic films are the same half-metal, produced an output (1%) which is three to ten times larger.

The structure as shown in FIG. 12 may be formed from a substrate, $Fe_3O_4$ (40 nm), $TiO_2$ (5 nm), and $Fe_3O_4$ (10 nm), with $TiO_2$ being the spacer. This structure is expected to give a ratio of change in magnetoresistance (exceeding 10%) which is much larger than that of the structure composed of a substrate, $Fe_3O_4$, Au, and NiFe.

The film of GMR structure mentioned above may be applied to a magnetic reproducing head or a GMR sensor. In this case, the pinned layer may be the one which utilizes the difference in coercive force between the pinned layer and the free layer. However, for maximum use of the magnetic characteristics, the pinned layer should preferably be of such a type that it is in contact with the anti-ferromagnetic film, so that its magnetization is pinned by the exchange bonding magnetic field.

Figure 20:
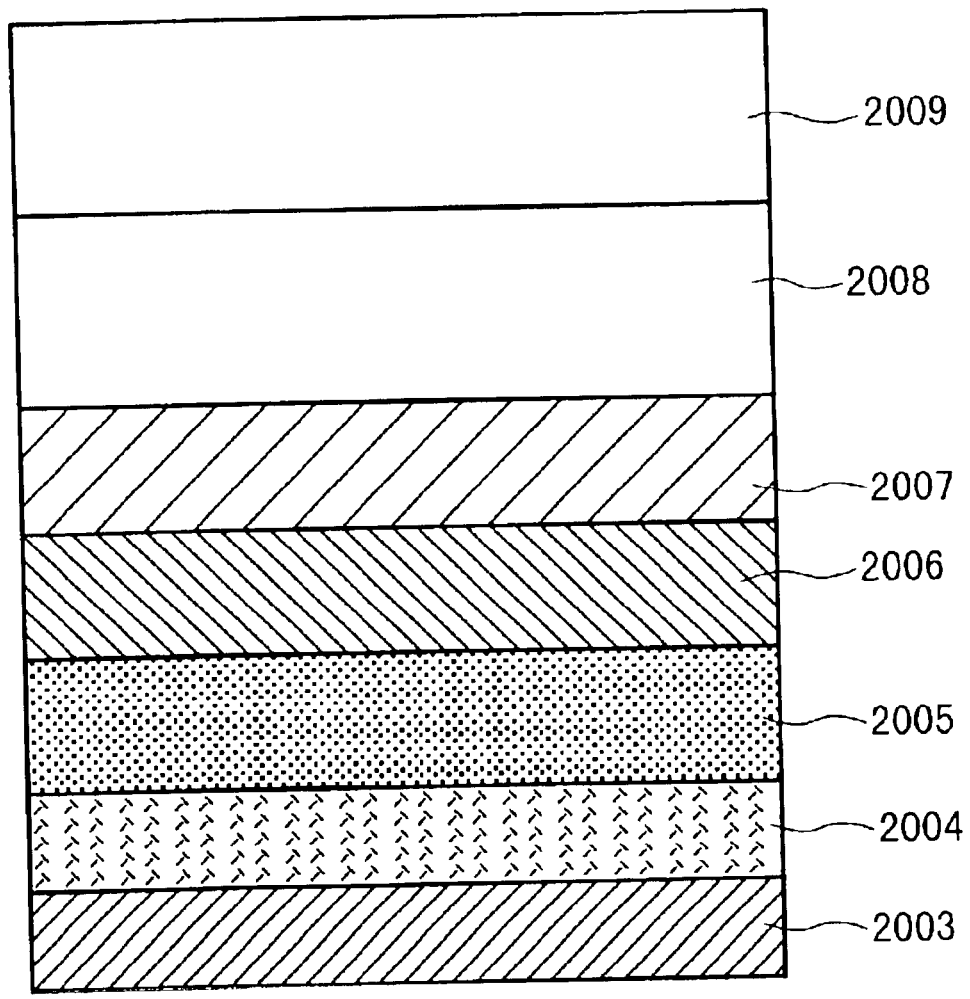
FIG. 20 is a diagram showing the magneto-resistive device to which the present invention is applied.

In the conventional GMR device, one way to reduce the thickness of the pinned layer was to laminate a Ru film, metal soft magnetic film, and anti-ferromagnetic film to that side of the pinned layer which is opposite to the spacer. In this case, the thickness of Ru film is controlled so that the pinned layer and the metal soft magnetic film make an anti-ferromagnetic bond. The resulting structure is called a laminated ferri structure. This structure is a common one. This is applied to the CPP structure with the GMR structure mentioned above. A description will be provided of the structure (in which the magnetization of the pinned layer is anti-ferromagnetically bonded) and its characteristic properties. FIG. 20 shows an example of the structure in which an anti-ferromagnetic film (AF film) is at the lower side. Samples were prepared by sequentially laminating on a substrate an underlying film containing Cr, an anti-ferromagnetic layer 2003 (12 nm thick), a soft magnetic layer 2004 (nm), a noble metal layer 2005 (nm), a pinned layer 2006 (nm), a GMR spacer 2007 (2 nm thick), and a free layer 2008 (3 nm thick). The pinned layer 2006 magnetizes differently depending on the material and thickness of the noble metal layer 2005 thereunder. That is, the magnetization of the pinned layer 2006 combines with the magnetization of the soft magnetic layer 2004 (which is magnetized because magnetization is pinned by the anti-ferromagnetic layer 2004), and the combined magnetic fields cause the magnetic loop to shift, resulting in the behavior of a spin valve. It was found that an anti-ferromagnetic bond called a laminate ferri structure results if the laminate structure is formed from an anti-ferromagnetic layer 2003, a soft magnetic layer 2004 which contains a metal magnetic material (NiFe), a noble metal layer 2005 (about 0.8–1.2 nm thick) containing Ru as a noble metal, and a pinned layer 2006 containing an oxide magnetic material ($Fe_3O_4$). The anti-ferromagnetic bond was obtained when the noble metal layer is formed from any one of Pt, Pd, Rh, Ru, Ir, Au, and Ag, and has a thickness of 01.8 nm. In to actual practice, this effect is produced even though the noble metal layer is absent; however, a better effect is produced when the noble metal layer is present.

Among the anti-ferromagnetic materials having a high coupling factor are CrMnPt and MnPt (They need heat treatment) Other materials, such as PdMnPt, MnIr, MnRh, NiO, and anti-ferromagnetic materials containing any one of them, are also effective if they have a low coercive force. MnIr is particularly useful because it provides coupling at room temperature. CrMnPt or MnPt produces the maximum coupled magnetic field of about 900 Oe, and MnIr produces the maximum coupled magnetic field of about 550 Oe when the $Fe_3O_4$ layer is 5 nm thick.

The foregoing considerations suggest the possibility of obtaining a magnetoresistive effect film which gives a high ratio of change in magnetoresistance as an output of the CPP-GMR structure. The above-mentioned structure is also effective for the magnetoresistive effect film in which the pinned layer is formed from a half-metal oxide magnetic material other than $Fe_3O_4$.

There are other structures which differ from those mentioned above in that the soft magnetic layer 2004 is formed from a soft magnetic metal typified by $Ni_{80}Fe_{20}$ and $Co_{90}Fe_{10}$.

Figure 21:
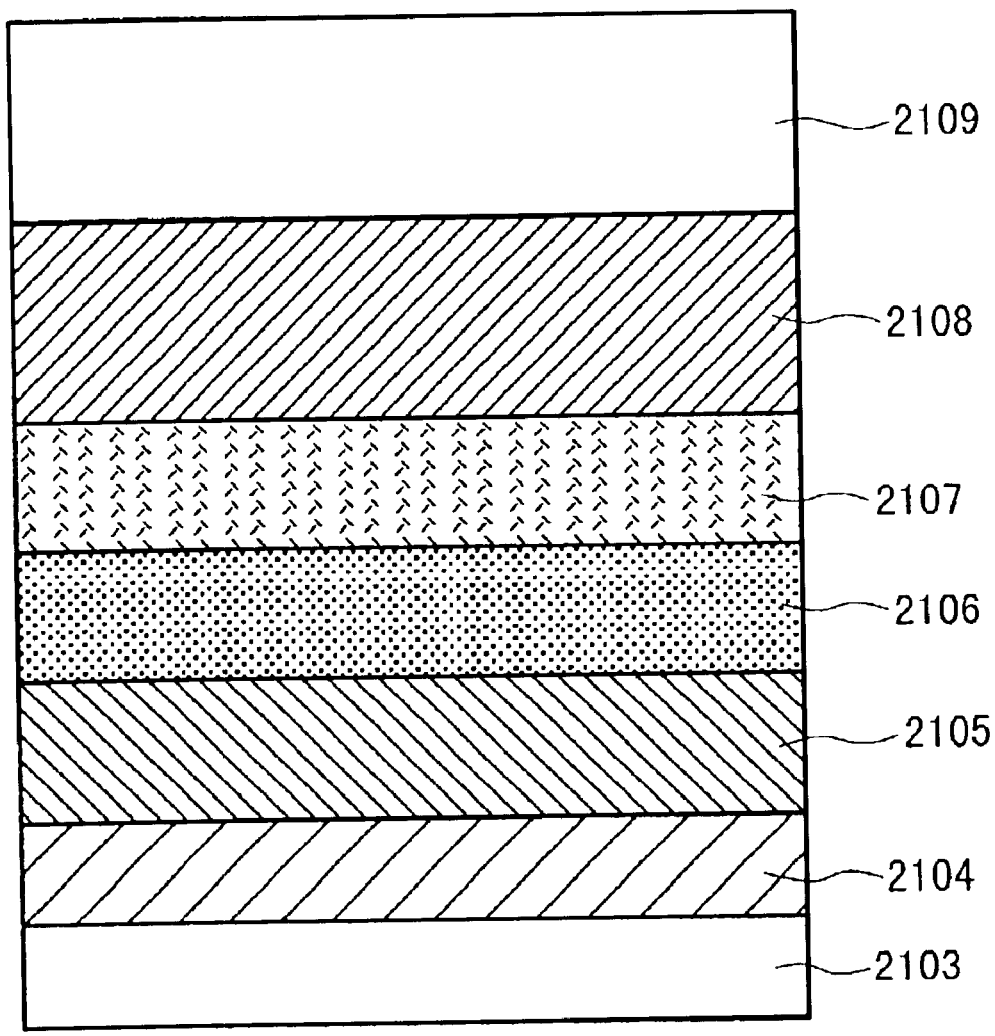
FIG. 21 is a diagram showing the magneto-resistive device to which the present invention is applied.

FIG. 21 shows an example of the structure in which an anti-ferromagnetic film is at the upper side. Samples were prepared by sequentially laminating on a substrate 2101 an underlying layer 2102 containing Cr, a free layer 2103 containing CoFe, a GMR spacer 2104 (2.1 nm), a $Fe_3O_4$ pinned layer 2105 (2 nm), a noble metal layer 2108 (0 to 1 nm), a soft magnetic layer 2107 (3 nm) containing NiFe, an anti-ferromagnetic layer 2108 (12 nm) containing MnPt, and a protective layer 2109 (3 nm) containing Ta. These samples were also found to produce the magnetoresistive effect in the same way as mentioned above. Each component is identical with that mentioned above.

EXAMPLE 4

Samples of magnetoresistive devices of CPP-GMR structure composed of layers, as shown in FIGS. 20 and 21, were prepared. The layer is made up of the materials shown in FIGS. 8, 9, 10, 11, 12, and 15. Characteristic properties required of the PP-GMR film are:

(a) Sheet resistivity and area product RA no higher than 1 $\Omega \cdot \mu m^2$ (depending on the device area).
(b) Ratio of change in magnetoresistance no lower than 2%.
(c) Coercive force of magnetic material.

The sheet resistivity and area product (RA) is calculated for the device measuring 120×120 nm in which an oxide magnetic material (such as $Fe_3O_4$) is used as the half-metal. A layered structure is assumed which consists of a noble metal layer (2005, 2106), a pinned layer (2006, 2105) containing an oxide half-metal, a spacer (2007, 2104) containing a noble metal, and a free layer (2008, 2103). The sample has a layered structure of Pt (10 nm), $Fe_3O_4$ (varied), Au (3 nm), and $Fe_3O_4$ (5 nm). The resistivity of $Fe_3O_4$, Pt, and Au were 3500–35000, $\mu\Omega$-cm, 30 $\mu\Omega$-cm, and 2 $\mu\Omega$-cm, respectively.

When the $Fe_3O_4$ film is 20 nm thick or 10 nm thick, the device resistance is about 73 $\Omega$ and the sheet resistivity is 1.05 $\Omega \cdot \mu m^2$, assuming that the resistivity of $Fe_3O_4$ is 3500 $\mu\Omega$-cm. Also, when the $Fe_3O_4$ film is 10 nm thick or 5 nm thick, the device resistance is about 36 $\Omega$ and the area resistivity product is 0.5 $\Omega \cdot \mu m^2$. When the $Fe_3O_4$ film is 5 nm thick or 2.5 nm thick, the device resistance is about 18 $\Omega$ and the resistivity area product is 0.25 $\Omega \cdot \mu m^2$.

The reproducing head for a recording density of 140 Gb/in$^2$ should have CPP-GMR characteristics which meet the requirement that the film thickness of $Fe_3O_4$ is no larger than 30 nm and the area is no larger than 10 $\mu m^2$. This requirement can be achieved because the sheet resistivity is no larger than 1 $\Omega \cdot \mu m^2$. The sheet resistivity may be reduced further if a 3d metal material (such as Fe) is used for the counter magnetic material.

If the $Fe_3O_4$ film is 30 nm thick, a device measuring 250×250 nm has a device resistance of about 18 $\Omega$. If the $Fe_3O_4$ film is 50 nm thick, the same device described as above has a device resistance of about 30 $\Omega$ and a sheet resistivity is of 1.75 $\Omega \cdot \mu m^2$. In actual practice, however, the resistance could be ten times (at maximum) as high as the value given above, because $Fe_3O_4$ varies in resistivity depending on its manufacturing process. Even in that case, it is possible to produce a magnetoresistive film that realizes a device resistance of 20–200 $\Omega$.

A device measuring 120×120 nm is usable satisfactorily if the total film thickness is about 30 nm in view of the fact that $TiO_2$ in the $Fe_3O_4/TiO_2/Fe_3O_4$ structure has a resistivity of about 10000 $\mu\Omega$-cm. With a $\Delta R/R$ of 5%, the areal output ($A\Delta R$) would be about 50 m$\Omega \cdot \mu m^2$. Therefore, the device measuring 120×120 nm will have a $\Delta R$ of about 5 $\Omega$, which is a sufficiently large output. This value is much larger than that of the conventional film composed of Ta (1 nm), NiFe (3 nm), MnPt (15 nm), CoFe (3.5 nm), Cu (3 nm), CoFe (3 nm), and Ta (1 nm). This conventional film, with a reduced size of 0.1×0.1 µm, has a resistance (R) of about 0.5 Ω, and, hence, it merely gives an output (ΔR) as small as about 0.01 Ω even though the ΔR/R is 2%.

EXAMPLE 5

This example demonstrates an application of the present invention to a magnetic head. The magnetoresistive device has the CPP-GMR film constructed as shown in FIGS. 20 and 21 (which was mentioned in Example 2). The film is composed of the materials shown in FIGS. 8, 9, 10, 11, 12, and 15. The magnetoresistive device may be applied to a magnetic head having an in-gap type structure or a yoke type structure.

The magnetic head having an in-gap type structure is constructed such that a magnetic sensor film is held between a pair of shields, and its cross section facing the recording medium is exposed. The magnetic head having a yoke type structure is constructed such that a magnetic sensor is not exposed at the surface facing the recording medium, but is arranged deep in the yoke film, which is a soft magnetic body resembling the character C. This structure causes the electrode to function also as a shield and provides a domain control mechanism. However, if the device size is sufficiently small, no domain walls occur in the device. In this case the domain control mechanisms in this structure may not be necessary.

Figure 22:
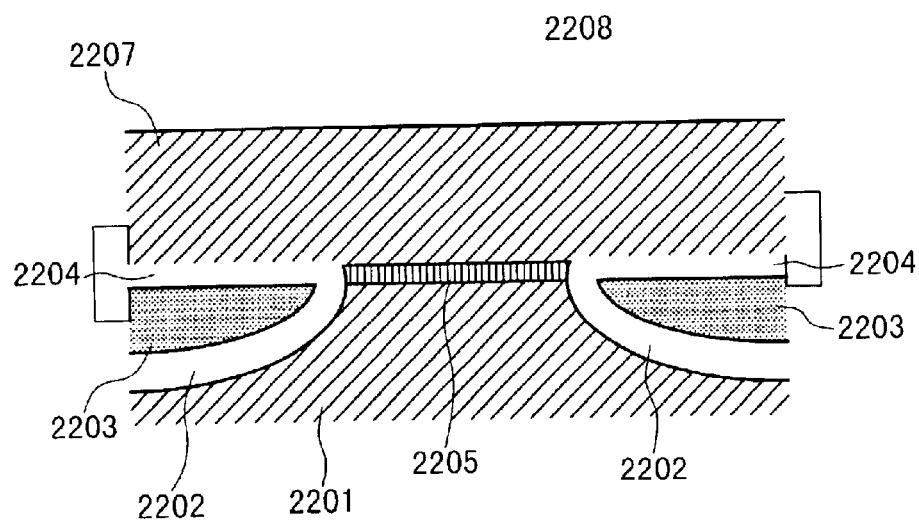
FIG. 22 is a diagrammatic sectional view of the CPP-GMR reproducing head of in-gap type to which the present invention is applied (as viewed from the side facing the recording medium)

FIG. 22 is a sectional diagram of the reproducing head of the in-gap type in which the electrode functions also as a shield, as viewed from the surface facing the recording medium. This reproducing head is formed in the following manner. First, the surface of the part 2201 (which functions as the bottom shield and the bottom electrode) is coated with a lift-off material. The film of the lift-off material is patterned such that the part 2205 (which becomes the magnetic sensor) remains. The magnetoresistive film 2205 is etched by ion milling. After etching, the domain control film 2203 is formed from a hard magnetic material, such as CoCrPt and CoCrPtZrO$_2$, in such a way that it is held between the insulators 2204 and 2202. This domain control film eliminates noise due to domain behavior in the CPP-GMR sensor film, thereby improving the accuracy in measurement of the magnetic field. The domain control film 2203 is more effective if it is formed on an underlying film of Cr or Ta. The magnetoresistive device may dispense with the domain control film, if it is sufficiently small and it generates no magnetic walls therein.

After the magnetic domain control film 2203 and the insulator 2204 have been formed, the lift-off mask is removed. Then the part 2207 (which functions as the top shield and electrode) is formed. Finally, the top surface is covered with a protective insulating film 2208 that is thicker than 100 nm and which is composed of Al$_2$O$_3$ and SiO$_2$.

Figure 23A:
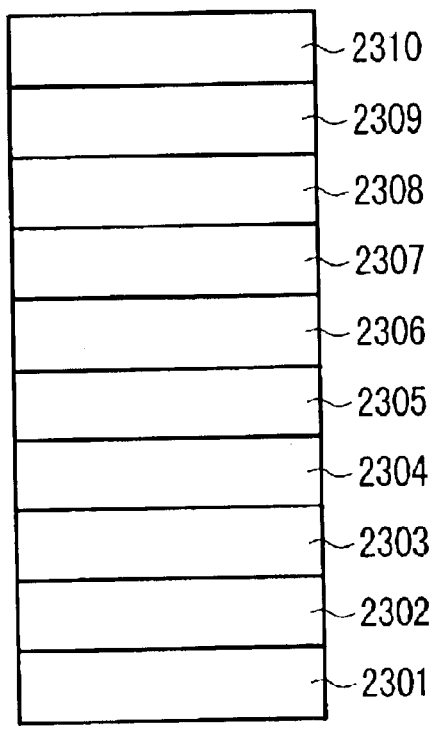
FIGS. 23A and 23B are diagrams showing the magneto-resistive device to which the present invention is applied.
Figure 23B:
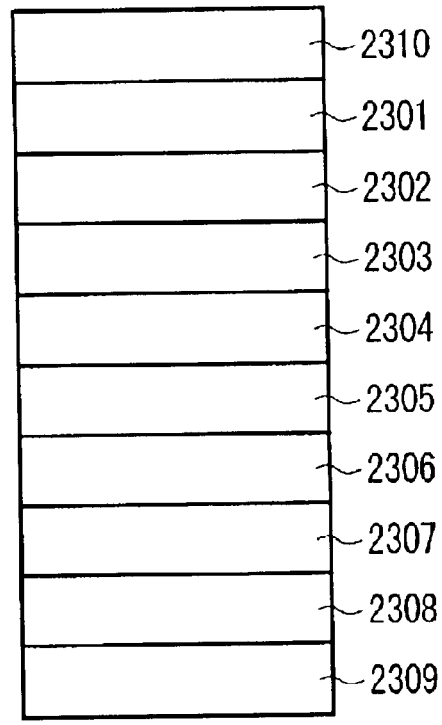

The sensor film needs a change in its structure if magnetic domains are to be controlled by the closed flux structure (CFS). FIGS. 23A and 23B show the structure of the sensor film which has been modified due to introduction of CFS. The layer structure shown in FIG. 20 is modified by the addition of three layers (non-magnetic metal film 2307, soft magnetic film 2308, and antiferromagnetic film 2308) on the free layer, as shown in FIG. 23A. The non-magnetic metal film 2307 is about 3–10 nm thick, which is thicker than the noble metal film for antiferromagnetic coupling. Consequently, the free layer is affected only by the magnetic field from the end of the soft magnetic film. This is the way to control the magnetic domains. The same effect as described above is produced in the film structure shown in FIG. 23B. In this film structure, the anti-ferromagnetic film is placed on the soft magnetic film. This film structure also permits domain control satisfactorily so long as the device has a small surface area.

Figure 24:
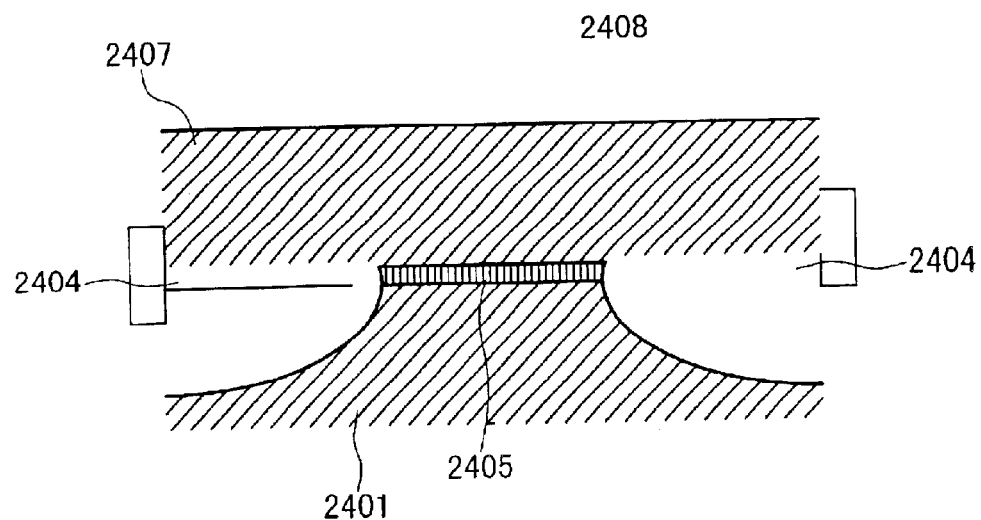
FIG. 24 is a diagrammatic sectional view of the CPP-GMR reproducing head of in-gap type to which the present invention is applied (as viewed from the side facing the recording medium)

The modified film structure also needs a change in the head structure. The head shown in FIG. 24 does not have the hard bias structure mentioned above. In other words, it consists of a bottom shield + electrode 2401, a GMR sensor film 2405, and a top electrode 2407, such that the GMR sensor film 2405 is held between insulators.

Figure 25:
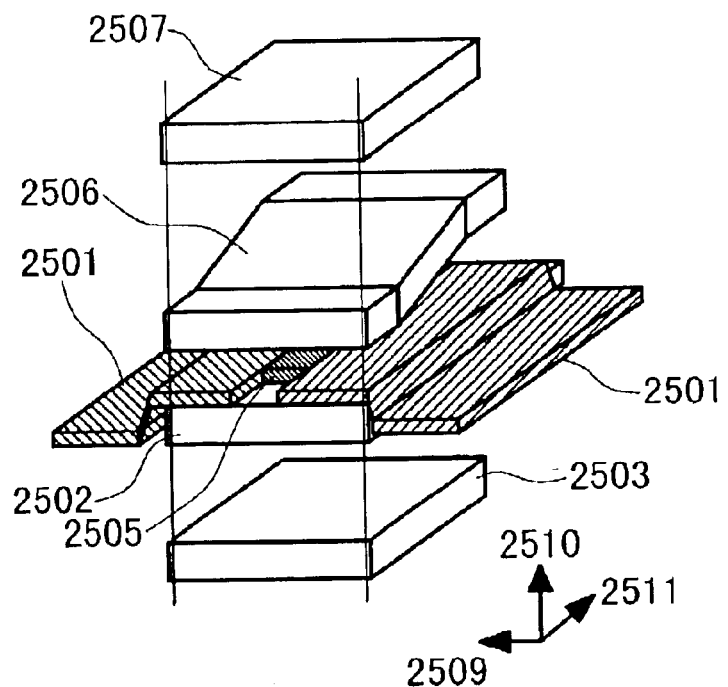
FIG. 25 is a diagram showing as an exploded perspective view how the yoke is positioned relative to the magneto-resistive device to which the present invention is applied.
Figure 26:
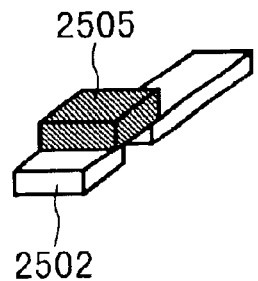
FIG. 26 is a diagram showing in perspective how the yoke is positioned relative to the magneto-resistive device to which the present invention is applied.

FIG. 25 is a schematic three-dimensional diagram showing a typical yoke structure and a magnetic domain control film. Three directions are indicated by 2509 (track width) 2510 (film thickness), and 2511 (sensor height). This structure prevents the sensor film 2505 from being exposed at the surface facing the recording medium. A sample of the structure shown in FIG. 25 was prepared and tested for its performance. This structure has yoke films 2506 and 2507 of soft magnetic material which are held between the bottom magnetic shield 2503 and the top magnetic shield 2507, both formed from Ni$_{81}$Fe$_{19}$. In the arrangement of FIG. 26, the upper yoke film 2506 and the lower yoke film 2502 form a C-shaped ring, with an insulator interposed between them. The upper yoke is in contact with the upper surface of the sensor and sends signals to the electrode of the top shield. The lower yoke is in contact with the lower surface of the sensor and communicates with the electrode of the bottom shield. The above-mentioned structure may be modified such that the lower yoke 2506 is tapered in the track width direction near the surface of the recording medium, the yoke is made thicker, or the yoke is discontinuous under the magnetic sensor. The magnetic domain control film 2501 is shown in FIG. 25. It controls magnetic domains in the lower yoke 2502 and the magnetoresistive sensor film. There is no diversion in the surrounding area. The magnetic domain control film may be constructed such that it controls the upper and lower yokes and magnetoresistive sensor film altogether or individually. It was found that either way achieves satisfactory magnetic domain control.

The structure shown in FIG. 25 may be changed to the one shown in FIG. 26 in order to increase the amount of magnetic flux to be detected by the magnetoresistive sensor. In the changed version, that part of the yoke which is in contact with the magnetic sensor film is discontinuous. The magnetic domain control film in this structure is also effective if it is formed from a high-resistance material. The magnetic sensor detects the magnetic field of the recording medium more sensitively than the semiconductor sensor film because it has a permeability as high as about 1000 times.

The magnetic sensor of this structure detects the magnetic field applied perpendicularly to the film surface. Therefore, it detects the magnetic field leaking from the recording medium, or in the case of longitudinal recording, it detects the magnetic flux leaking from the record end.

The magnetoresistive sensor mentioned in this example did not deteriorate in reproducing properties due to conduction from the magnetoresistive changing film to the magnetic domain control film even when the gap between the reproducing shields is smaller than 80 nm.

The above-mentioned reproducing head was modified by adding an insulating film on the top magnetic shield and a recording head mechanism thereon. The resulting sample worked well for both recording and reproduction.

EXAMPLE 8

Figure 27:
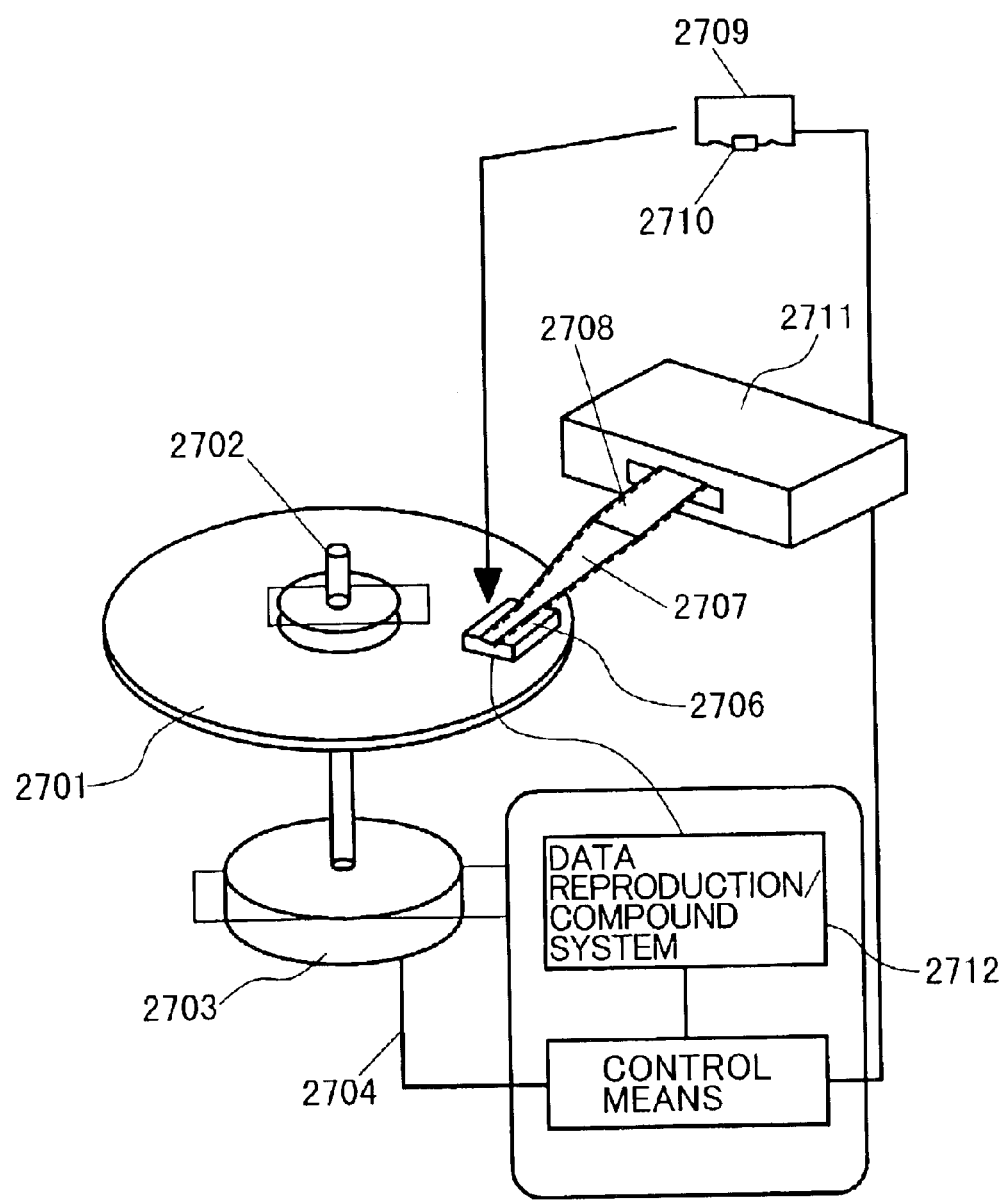
FIG. 27 is a schematic diagram showing the magnetic recording-reproducing unit to which the present invention is applied.

FIG. 27 shows a magnetic disk drive provided with a head constructed in accordance with the present invention. The magnetic disk drive consists of the following components.

Magnetic disk 2701 as a discoid magnetic recording medium, which is designed to record data in a concentric circular recording area called tracks.

Magnetic head 2710 (as defined in accordance with the present invention) to write and read data.

Actuator 2711 to move the magnetic head 2706 to a prescribed position on the magnetic disk 2701.

Means to control transmission and reception of data written and read by the magnetic head and to control the movement of the actuator.

The construction and action of the magnetic disk drive will be explained. At least one rotatable magnetic disk 2701 is supported by a revolving shaft 2702 and turned by a drive motor 2703. At least one slider 2706 is placed on the magnetic disk 2701. The slider 2706 supports the magnetic head 2710 of the present invention, which performs reading and writing.

As the magnetic disk 2701 turns, the slider 2706 moves on the disk surface to access a prescribed position where desired data are recorded. The slider 2706 is attached to the arm 2708 through the suspension 2707. The suspension 2707 brings the slider 2706 into close contact with the magnetic disk 2701 by its slight elastic force. The arm 2708 is attached to the actuator 2711.

The actuator 2711 is a voice coil motor (VCM), which has a movable coil placed in a stationary magnetic field. The coil has its moving direction and moving rate controlled by electric signals that come through the line 2704 from the control unit 2712. Therefore, the actuator in this example consists of the slider 2706, suspension 2707, arm 2708, actuator 2711, and line 2704.

The rotating magnetic disk 2701 creates an air flow (air bearing) between the slider 2706 and the disk surface. This air bearing lifts the slider 2706 above the surface of the magnetic disk 2701. Therefore, while the magnetic disk is running, the air bearing balances with the slight elastic force of the suspension 2707. Thus, the slider 2706 floats, keeping a certain distance from the magnetic is disk 2701, without coming into contact with the surface of the magnetic disk.

The control unit 2712 is usually composed of logic circuits, a memory, a microprocessor, etc. The control unit 2712 receives and transmits control signals through various lines and controls the various components of the magnetic disk drive. For example, the motor 2703 is controlled by motor control signals transmitted through the line 2704.

The actuator 2711 moves the selected slider 2706 to a desired data track on the magnetic disk 2701 in response to head position control signals and seek control signals received through the line 2704.

The magnetic head 2710 reads data from the magnetic disk 2701 and converts it into electric signals. The control unit receives the electric signals through the line 2704 and decodes them. The control unit also transmits electric signals to the magnetic head 2710 through the line 2704 so that the magnetic head 2710 writes data on the magnetic disk 2701. In other words, the control unit 2712 controls both the transmitting and the receiving of the information which the magnetic head 2710 reads and writes.

Signals for reading and writing may be transmitted directly from the magnetic head 2710. Control signals include access control signals and clock signals. In addition, the magnetic disk unit may have a plurality of magnetic disks and actuators, and the actuator may have a plurality of magnetic heads.

It is possible to build up a so-called disk array unit by combining the above-mentioned mechanisms. The magnetic recording unit provided with the magnetoresistive device of the present invention is capable of recording and reproducing data with a recoding density in excess of 150 Gb/in$^2$.

EXAMPLE 7

Figure 28:
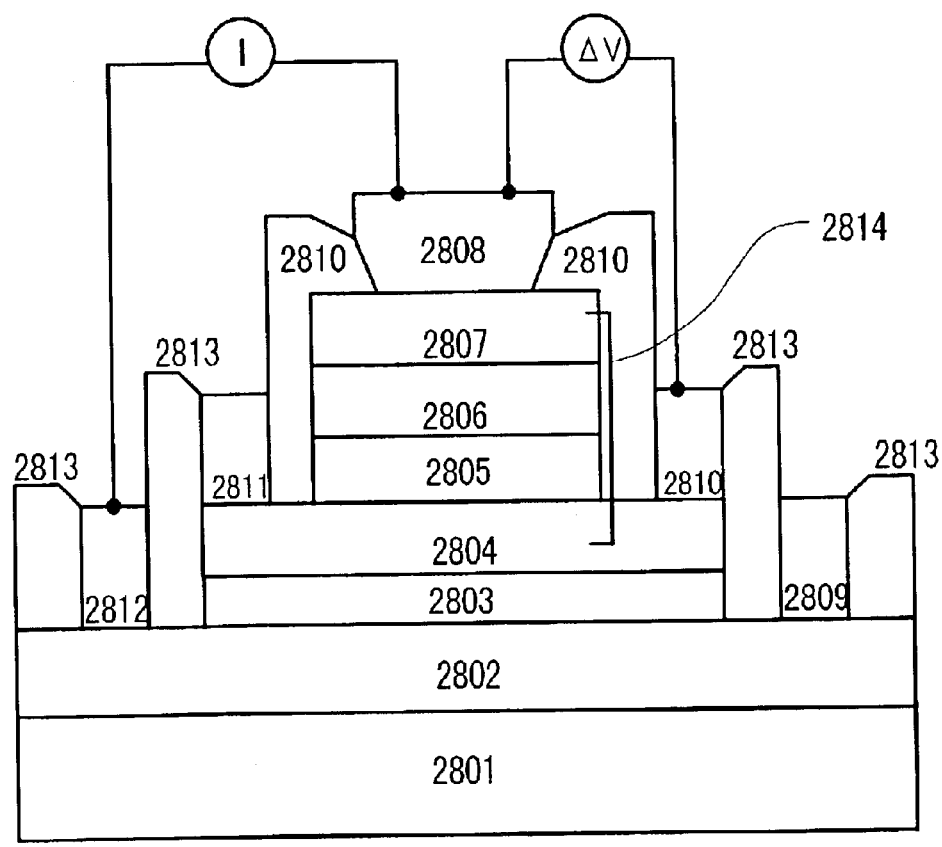
FIG. 28 is a schematic diagram showing the magnetic memory to which the present invention is applied.

FIG. 28 shows another example of the present invention. There is a substrate 2801, on which a 100% polarized spin injection layer 2802 is formed and a GMR structure 2814 is arranged, with a barrier layer 2803 placed thereunder. The GMR structure 1814 is composed of a ferromagnetic free layer 2804, a non-magnetic electron conductive layer 2805, a ferromagnetic pinned layer 2806, and an anti-ferromagnetic layer 2807, which are sequentially laminated one over the other. The ferromagnetic free layer 2804 has its magnetization freely rotated by the external magnetic field (H). The electrical resistance changes in response to the angle of rotation, thereby producing the magnetoresistive effect. The GMR structure in this example is that shown in FIGS. 20 and 21, which has the layer structure as shown in FIGS. 8, 9, 10, 11, 12, and 15.

The GMR structure 2814 has at its ends the insulators 2813, which prevent electrical leakage across the electrode 2808 and the electrode 2810.

The electrode 2808 is arranged on the anti-ferromagnetic layer 2807, the electrodes 2810 and 2811 are arranged on the ferromagnetic free layer 2804, and the electrodes 2809 and 2812 are arranged on the 100% polarized spin injection layer 2802. Current is applied across the electrodes 2810 and 2812 and the ratio of change in resistance across the electrodes 2808 and 2810 is regarded as the output of the GMR structure 2814.

The process and materials used to produce the above-mentioned magnetoresistive sensor will be described. On the silicon substrate 2801, there is formed the 100% polarized spin injection layer 2802, which is a dual layered film composed of Co (5 nm thick) and Cu (2 nm thick). The following layers are sequentially formed by RF sputtering.

barrier layer 2803 of $Al_2O_3$ (2 nm thick), ferromagnetic free layer 2804 of $Fe_3O_4$ (10 nm thick), non-magnetic electron conductive layer 2805 of Pt (2.2 nm thick), ferromagnetic pinned layer 2806 of $Fe_3O_4$ (2 nm thick), and anti-ferromagnetic layer 2807 of Ru/CoFe/PtMn (PtMn 12 nm thick).

These layers are patterned into a desired shape. $Al_2O_3$ is formed by natural oxidation from an Al film, 1.5 nm thick. Natural oxidation may be replaced by plasma oxidation. The patterned surface is coated with a photoresist, and the photoresist is patterned into a desired shape by photolithography. After patterning, the area of the ferromagnetic free layer 2804 is 20×20 $\mu$m and the area of the antiferromagnetic layer 2807 is 5×5 $\mu$m. The electrode 2808 is fabricated into a desired shape. The electrodes 2810 and 2811 are fabricated so that they are arranged on the ferromagnetic free layer 2804. The electrodes 2809 and 2812 are fabricated so that they are arranged on the 100% polarized spin injection layer 2802.

The thus obtained magnetoresistive device of the three-terminal type exhibited a ratio of change in resistance as high as 200%. This value is about 7 times as large as the one (30%) in the case of a conventional giant magnetoresistive device. This good result is due to the fact that the s-electron band of Cu formed in the 100% polarized spin injection layer is completely polarized in the vicinity of the Fermi level and only an up spin flows into the GMR structure 2814, thereby increasing the output.

In this example, the barrier layer 1803 is formed from $Al_2O_3$; however, it may also be formed from any one of MgO, $SrTiO_3$, $HfO_2$, TaO, NbO, and MoO.

Incidentally, the above-mentioned polarized spin injection layer may be formed from a half-metal ferromagnetic material, such as $Sr_2FeMoO_7$, $La_{0.7}Sr_{0.3}MnO_3$, MnSb, $CrO_2$, MnAs, Co—$TiO_2$, and CrAs. It may also be a dual layered film composed of a ferromagnetic layer and a non-magnetic layer, the former being formed from Mn, Co, Ni, or Fe in the form of a simple substance or an intermetallic compound thereof, the latter being formed from Au, Ag, Pt, Pd, Ir, Cr, or Ru.

The magnetoresistive device mentioned above is used to produce a magnetic head having a very high output.

EXAMPLE 8

Figure 29:
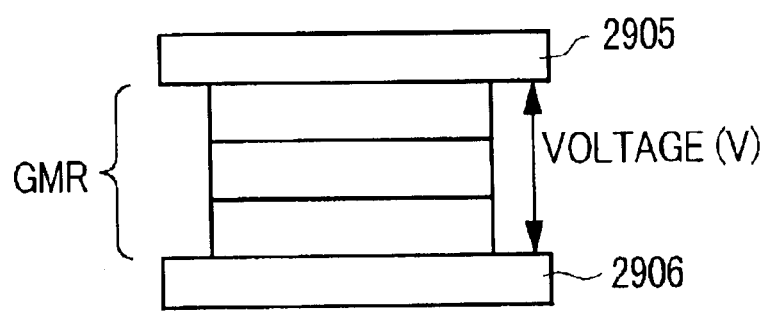
FIG. 29 is a schematic diagram showing the magnetic memory to which the present invention is applied.

FIG. 29 shows an example of the magnetic memory based on the magnetoresistive device of the present invention. The GMR structure used in this magnetic memory is composed of the materials shown in FIGS. 8, 9, 10, 11, and 12. The GMR structure shown in FIGS. 20 and 21 is used. The magnetoresistive device is in contact with a bit line 2905 and a word line 2906.

Figure 30A:
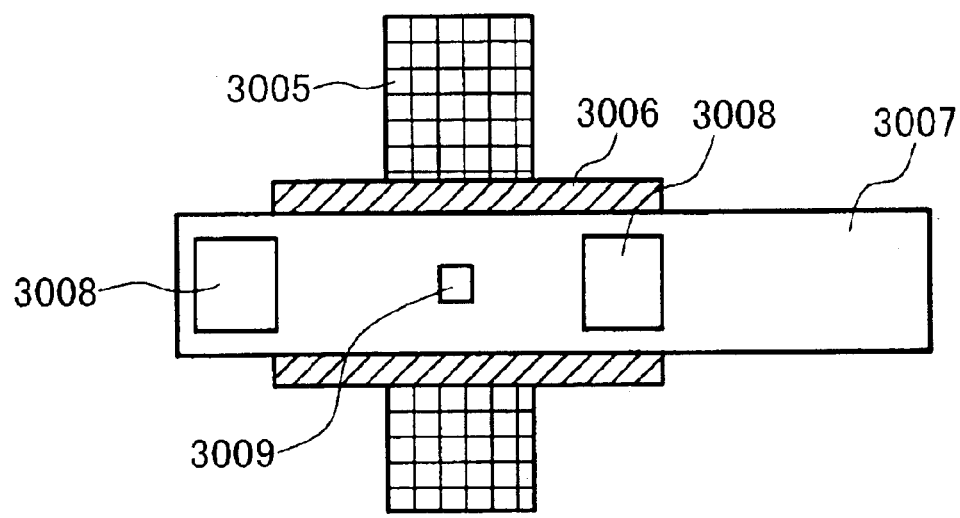
FIG. 30A is a diagram showing a top view and FIG. 30B is a diagram showing a side view of the magnetic memory to which the present invention is applied.
Figure 30B:
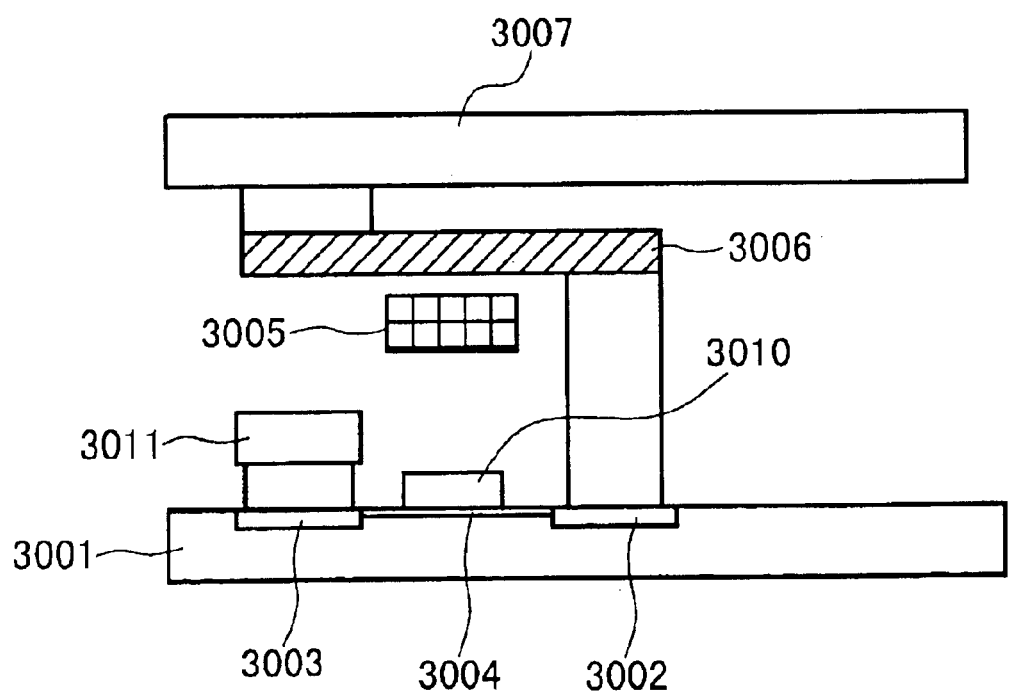

FIGS. 30A and 30B show a typical structure of the magnetic memory, or so-called MRAM. The substrate 3001 is a CMOS structure, in which there is a transistor having terminals representing emitter 3003, base 3010, and collector 3002. The diffused layer 3004, which is formed on the semiconductor substrate, permits conduction of electrons.

The magnetic memory device consists of a plurality of cells arranged in parallel, each cell having a magnetic sensor 3009 for information recording, an MR sensor film 3006 including electrodes holding sensor 3009 between them, a bit wire 3007 connected to said sensor and which supplies current to the device, a word line 3005 (which holds the MR sensor film 3006 and is disposed opposite to said bit line 3007 and away from the MR sensor film 3006 and crosses said bit line at right angle and performs recording action on the magnetic sensor film), an amplifier system to amplify recorded signals, and read word lines to switch reading and writing. The magnetic sensor 3009 in this magnetic memory device contains a magnetic material as shown in Examples 1, 2, 3, and 4 of the present invention. Current flows in the direction perpendicular to the film surface or in one direction of the film surface; therefore, it operates as a magnetic sensor.

Also, the magnetic sensor 3009 is a square, with each side measuring 0.1–0.25 μm. It is fabricated by electron beam writing. The magnetic sensor 3009 has the film structure as shown in FIG. 20 or FIG. 21. The area surrounding the magnetic sensor is covered with insulating film. The shape of the device may be that of a square, polygon, or circle so that current will flow in the perpendicular direction. The magnetic sensor magnetizes in the direction of current flowing through the word line 3005 and the bit line 3007. The direction of magnetization rotates as the direction of the combined magnetic field changes in the magnetic sensor When the direction of magnetization of the free layer of the magnetic sensor rotates, magnetic domains occur in the free layer. Such magnetic domains fluctuate the resistance induced by the magnetic field and lower the S/N ratio. This disables memory reading. This necessitates a magnetic domain control film for better control. Thus, the magnetic domain control film 3006 is arranged at both ends of the magnetic sensor. In this way, it is possible to control the magnetic domains without loss due to diversion to the magnetic domain control film.

Figure 31:
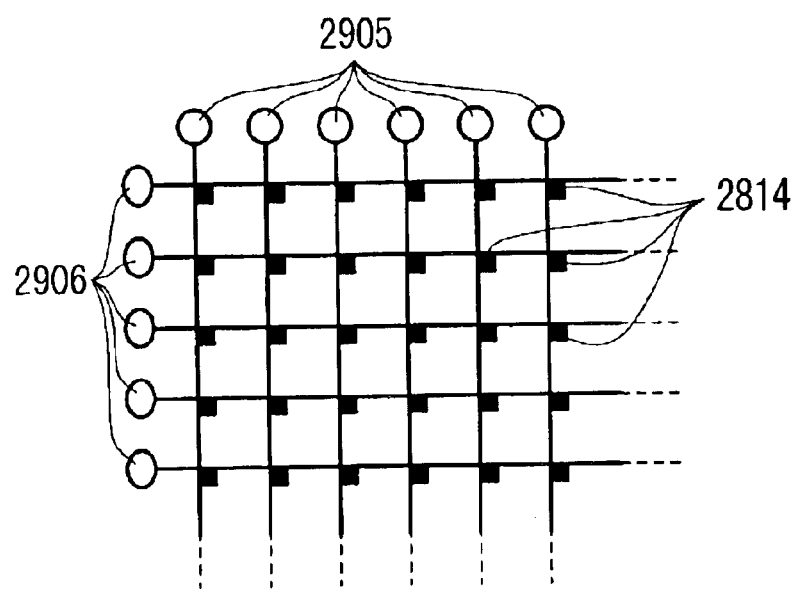
FIG. 31 is a schematic diagram showing the magnetic memory to which the present invention is applied.

FIG. 31 shows an example of the integrated circuit in which the magnetoresistive device shown in FIGS. 29, 30A and 30B functions as each cell. The magnetoresistive device is placed at the intersection of a bit line 2905 and a word line 2906. The reading and writing of information are accomplished by selecting the bit line and word line which intersect at the desired cell.

It is possible to reduce the area of the memory cell and achieve integration having a large capacity by incorporating the device into the magnetic memory.

Additional examples are given below.

(1) A magnetic head having the magneto-resistive device mentioned above.

(2) A magnetic head which has the magneto-resistive device mentioned above, an electrode to supply current to said magneto-resistive device, and a 100% polarized spin injection layer which is connected to said magneto-resistive device through a barrier layer.

(3) A magnetic recording unit consisting of a magnetic recording medium having a magnetic recording layer, a drive unit to drive the magnetic recording medium, a magnetic head having the magneto-resistive device mentioned above, an actuator to move the magnetic head to a desired position on the magnetic recording medium, and a signal processing means to reproduce output signals from the magnetic head.

(4) The magnetic recording unit mentioned above, in which the magnetic head has a recording part and a reproducing part.

(5) A magnetic memory which consists of a magnetic sensor having the magneto-resistive device mentioned above, a bit line which is connected to the magnetic sensor and supplies current to the device, a word line which intersects said bit line at a right angle and performs recording action on said magnetic sensor film, said word line being at a position spaced from said magnetic sensor film at the position opposite to said bit line with said magnetic sensor film interposed therebetween, an amplifying system to amplify recording signals, and a plurality of cells arranged in parallel, which are provided with word lines to perform the switching of reading and writing.

As mentioned above, the magnetoresistive device pertaining to the present invention is a sensor film for CPP-GMR, which utilizes a half-metal magnetic material (oxide magnetic material) and a metal magnetic material in combination. It gives a high ratio of change in resistance in response to an applied magnetic field and a high electric resistance, and it produces a large GMR output In addition, the magnetic recording unit provided with the magnetoresistive device can be used in combination with a magnetic recording medium having an areal recording density in excess of 200 Gb/in$^2$ Moreover, the magnetic memory provided with the magnetoresistive device will have a higher density than the current memory.

What is claimed is:

1. A magneto-resistive device having a first magnetic layer, a second magnetic layer, and an electron conductive spacer formed between and in direct contact with both of said first and second magnetic layers, wherein said first magnetic layer contains a magnetic material whose conduction electrons belong to a first energy band and said second magnetic layer contains a magnetic material whose conduction electrons belong to a second energy band, with said first and second energy bands being attributable to orbitals of the same kind, wherein a current flows in a perpendicular direction between said first and second magnetic layers through said electron conductive spacer.

2. The magneto-resistive device as defined in claim 1, wherein at least either of the first magnetic layer and the second magnetic layer contains at least one species of $Fe_3O_4$, $CrO_2$, and LaSrMnO as the half-metal magnetic material which is a d-electron conductor.

3. The magneto-resistive device as defined in claim 1, wherein at least either of the first magnetic layer and the second magnetic layer contains a Heusler alloy having the composition of $(MMn)_2Al_2$ (M=Cu, Ni, Co, or Fe) or $Co_2MnX$ (X=Al, Si, Sn, or Ge) as the half-metal magnetic material which is an s-electron conductor.

4. The magneto-resistive device as defined in claim 1, wherein at least either of the first magnetic layer and the second magnetic layer contains a magnetic semiconductor CrAs as the half-metal magnetic material which is a d-electron conductor.

5. The magneto-resistive device as defined in claim 1, wherein at least either of the first magnetic layer and the second magnetic layer contains, as a highly polarized material which is a d-electron conductor, Fe or an Fe-containing 3d ferromagnetic compound FeX, where X denotes at least one species of Ni, Co, C, N, and O, with the Fe content being no lower than 50%.

6. The magneto-resistive device as defined in claim 1, wherein at least either of the first magnetic layer and the second magnetic layer contains, as a highly polarized material which is an s-electron conductor, Ni, Co, or NiCo-containing 3d ferromagnetic compound (NiCo)X, where X denotes at least one species of Fe, C, N, and O, with the (NiCo) content being no lower than 50%.

7. The magneto-resistive device as defined in claim 1, wherein the electron conductive spacer is a noble metal layer containing at least one species of Au, Cu, Pt, Au, Pd, Ag, Rh, and Ru, which is an s-electron conductor.

8. The magneto-resistive device as defined in claim 1, wherein the electron conductive spacer contains at least one species of noble metal, perovskite type oxide and rutile type oxide, which is a d-electron conductor.

9. The magneto-resistive device as defined in claim 8, wherein the noble metal which is a d-electron conductor is at least one species of Pt, Pd, Ag, Rh, and Ru.

10. The magneto-resistive device as defined in claim 1, wherein the first magnetic layer and the second magnetic layer contains $Fe_3O_4$ as the half-metal magnetic material and the spacer contains SrTiO as the perovskite type oxide or $TiO_2$ as the rutile type oxide.

11. The magneto-resistive device as defined in claim 1, wherein the first magnetic layer contains a magnetic material which is a d-electron conductor, the second magnetic layer contains a magnetic material which is an s-electron conductor, and the electron conductive spacer contain a non-magnetic material which is a d-electron conductor.

12. The magneto-resistive device as defined in claim 1, wherein the first magnetic layer contains a magnetic material which is a d-electron conductor, the second magnetic layer contains a magnetic material which is a d-electron conductor, and the electron conductive spacer contain a non-magnetic material which is a d-electron conductor.

13. The magneto-resistive device as defined in claim 1, wherein the first magnetic layer contains a magnetic material which is a d-electron conductor, the second magnetic layer contains a magnetic material which is a d-electron conductor, and the electron conductive spacer contain a non-magnetic material which is an s-electron conductor.

14. The magneto-resistive device as defined in claim 1, wherein the first magnetic layer contains a magnetic material which is an s-electron conductor, the second magnetic layer contains a magnetic material which is an s-electron conductor, and the electron conductive spacer contain a non-magnetic material which is an s-electron conductor.

15. The magneto-resistive device as defined in claim 1, wherein the first magnetic layer changes in the direction of magnetization when an external magnetic field is applied while current is flowing from the first magnetic layer to the second magnetic layer through the electron conductive spacer.

16. The magneto-resistive device as defined in claim 1, wherein an antiferromagnetic layer is formed on that surface of the second magnetic layer which is opposite to the surface facing the electron conductive spacer, so that the magnetization of the second magnetic layer is pinned.

17. The magneto-resistive device as defined in claim 1, wherein a noble metal layer or a metallic layer containing an alloy of face-centered cubic structure is formed between the second magnetic layer and an antiferromagnetic layer.

18. A magneto-resistive device having a first magnetic layer, a second magnetic layer, and an electron conductive spacer formed between and in direct contact with both of said first and second magnetic layers, wherein at least either of said first magnetic layer and said second magnetic layer contains a magnetic material whose conduction electrons belong to a first energy band and said electron conductive spacer contains a non-magnetic material whose conduction electrons belong to a second energy band, with said first and second energy bands being attributable to orbitals of the same kind, wherein a current flows in a perpendicular direction between said first and second magnetic layers through said electron conductive spacer.

19. A magneto-resistive device having a first magnetic layer, a second magnetic layer, and an electron conductive spacer formed between and in direct contact with both of said first and second magnetic layers, wherein said first magnetic layer and said second magnetic layer contain a half-metallic ferromagnetic material or a highly polarized magnetic material, wherein a current flows in a perpendicular direction between said first and second magnetic layers through said electron conductive spacer.

20. The magneto-resistive device as defined in claim 19, wherein the half-metallic ferromagnetic material is at least one species of oxide magnetic material, magnetic semiconductor, and Heusler alloy.

* * * * *